(12) United States Patent
You et al.

(10) Patent No.: US 11,848,043 B2
(45) Date of Patent: Dec. 19, 2023

(54) MEMORY DEVICE AND MEMORY SYSTEM

(71) Applicant: SAMSUNG ELECTRONICS CO., LTD., Suwon-si (KR)

(72) Inventors: Jung Min You, Hwaseong-si (KR); Ho-Youn Kim, Seoul (KR); Won-Hyung Song, Osan-si (KR); Hi Jung Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 95 days.

(21) Appl. No.: 17/689,064

(22) Filed: Mar. 8, 2022

(65) Prior Publication Data
US 2023/0042955 A1    Feb. 9, 2023

(30) Foreign Application Priority Data
Aug. 9, 2021    (KR) ........................ 10-2021-0104285

(51) Int. Cl.
G11C 11/406    (2006.01)
G11C 11/408    (2006.01)

(52) U.S. Cl.
CPC ........ G11C 11/406 (2013.01); G11C 11/4085 (2013.01); G11C 11/4087 (2013.01)

(58) Field of Classification Search
CPC ............. G11C 11/406; G11C 11/4087; G11C 11/4085
See application file for complete search history.

(56) References Cited

U.S. PATENT DOCUMENTS

| | | | |
|---|---|---|---|
| 9,892,779 B2 | 2/2018 | Kang et al. | |
| 10,546,627 B2 | 1/2020 | Kang | |
| 10,770,127 B2 | 9/2020 | Shore et al. | |
| 10,825,534 B2 | 11/2020 | Nale | |
| 10,860,222 B2 | 12/2020 | Shin et al. | |
| 10,908,846 B2 | 2/2021 | Lee et al. | |
| 2020/0167216 A1 | 5/2020 | Lee et al. | |
| 2020/0211633 A1* | 7/2020 | Okuma | G06F 12/0646 |
| 2020/0251158 A1* | 8/2020 | Shore | G11C 11/407 |
| 2020/0349995 A1 | 11/2020 | Shore et al. | |
| 2021/0043248 A1 | 2/2021 | Lee et al. | |
| 2023/0206980 A1* | 6/2023 | He | G11C 11/406 |
| | | | 365/222 |

FOREIGN PATENT DOCUMENTS

KR    10-2018-0128711 A    12/2018

* cited by examiner

*Primary Examiner* — Mark A Giardino, Jr.
(74) *Attorney, Agent, or Firm* — Muir Patent Law, PLLC

(57) ABSTRACT

A memory device includes memory cells connected to a first word-line, wherein the memory cells include a data region in which data is stored and a counting value backup region in which the number of times the first word-line is activated is backed up, a counting table for storing a first row address corresponding to the first word-line and a first counting value as a counting result of the number of times the first word-line is activated, and a comparator configured to compare the first counting value with a first backed-up counting value stored in the counting value backup region; and when the first counting value is greater than the first backed-up counting value, back up the first counting value in the counting value backup region, or when the first backed-up counting value is greater than the first counting value, overwrite the first backed-up counting value into the counting table.

20 Claims, 23 Drawing Sheets

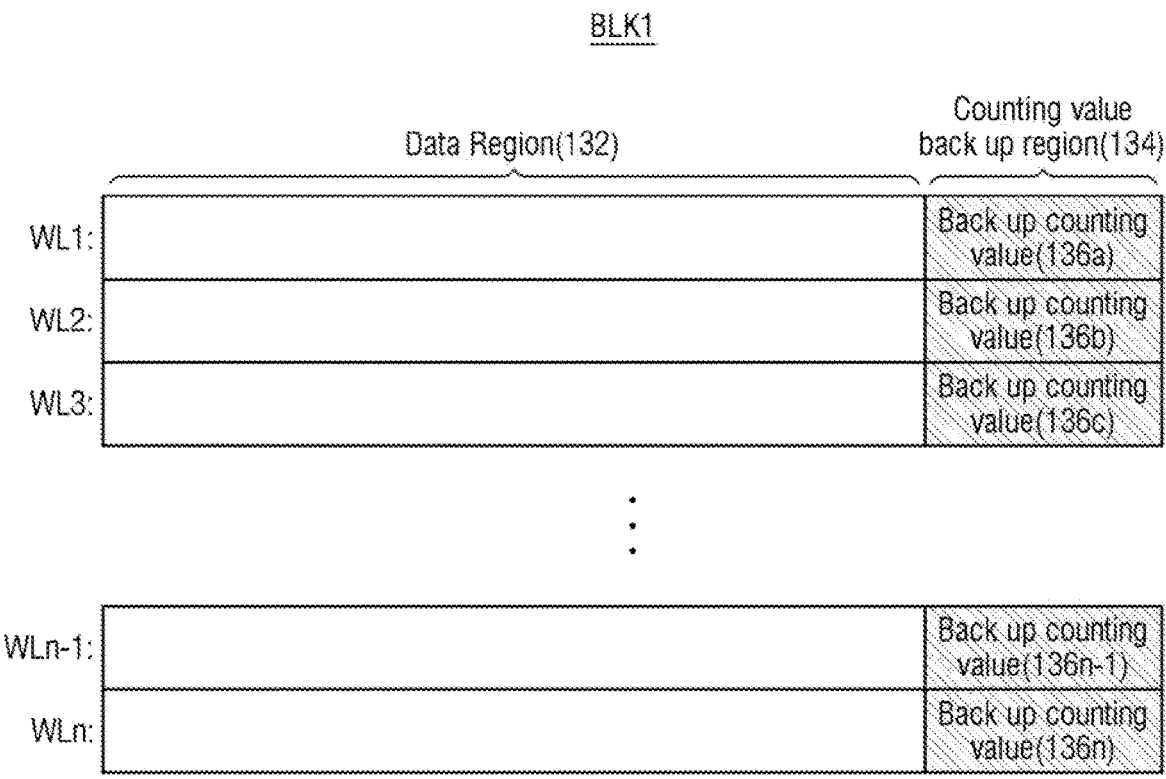

MEMORY DEVICE AND MEMORY SYSTEM

CROSS-REFERENCE TO RELATED APPLICATION

This application claims priority from Korean Patent Application No. 10-20210104285 filed on Aug. 9, 2021, in the Korean Intellectual Property Office, and all the benefits accruing therefrom under 35 U.S.C. 119, the entire contents of which are herein incorporated by reference.

BACKGROUND

1. Field

Embodiments relate to a memory device and a memory system.

2. Description of Related Art

As integration of a memory device increases, a spacing between multiple word-lines included in the memory device is decreasing. As the spacing between the word-lines decreases, a coupling effect between adjacent word-lines increases.

SUMMARY

Embodiments are directed to a memory device, including: a memory cell array including a plurality of memory cells connected to a first word-line, wherein each of the plurality of memory cells includes a data region in which data is stored and a counting value backup region in which the number of times the first word-line is activated is backed up, a counting table for storing therein a first row address corresponding to the first word-line and a first counting value as a counting result of the number of times the first word-line is activated, and a comparator configured to, comparing the first counting value with a first backed-up counting value stored in the counting value backup region; and when the first counting value is greater than the first backed-up counting value, back up the first counting value in the counting value backup region, or when the first backed-up counting value is greater than the first counting value, overwrite the first backed-up counting value into the counting table.

Embodiments are directed to a memory device, including: a control logic circuit configured to receive a command and an address from an external component, and generate a first voltage control signal based on the command, and generate a first row address and a first column address based on the address, a voltage generator for generating a first word-line voltage VWL based on the first voltage control signal, a row decoder for receiving the first word-line voltage and the first row address and delivering the first word-line voltage to the first row address, and a memory cell array including a plurality of memory cells connected to a first word-line corresponding to the first row address, wherein each of the plurality of memory cells includes a data region in which data is stored and a counting value backup region in which the number of times the first word-line is activated is backed up, a page buffer for receiving the first column address, and selecting a bit-line corresponding to the first column address, and transmitting and receiving the data to and from at least some of the plurality of memory cells, a counting table for storing therein the first row address and a first counting value 174 as a counting result of the number of times the first word-line is activated, and a comparator configured to, comparing the first counting value with a first backed-up counting value stored in the counting value backup region, and when the first counting value is greater than the first backed-up counting value, back up the first counting value in the counting value backup region, or when the first backed-up counting value is greater than the first counting value, overwrite the first backed-up counting value into the counting table.

Embodiments are directed to a memory system, including: a main processor including at least one CPU core, and a memory device exchanging data with the main processor, wherein the memory device includes, a memory cell array including a plurality of memory cells connected to a first word-line, wherein each of the plurality of memory cells includes a data region in which data is stored and a counting value backup region in which the number of times the first word-line is activated is backed up, a counting table for storing therein a first row address corresponding to the first word-line and a first counting value as a counting result of the number of times the first word-line is activated, and a comparator configured to, comparing the first counting value with a first backed-up counting value stored in the counting value backup region, and when the first counting value is greater than the first backed-up counting value, back up the first counting value in the counting value backup region, or when the first backed-up counting value is greater than the first counting value, overwrite the first backed-up counting value into the counting table.

BRIEF DESCRIPTION OF DRAWINGS

Features will become apparent to those of skill in the art by describing in detail example embodiments with reference to the attached drawings in which:

FIG. 4 is an example block diagram for illustrating a block of FIG. 1.

FIG. 5 is an example block diagram for illustrating the counting table.

DETAILED DESCRIPTION

Figure 1:
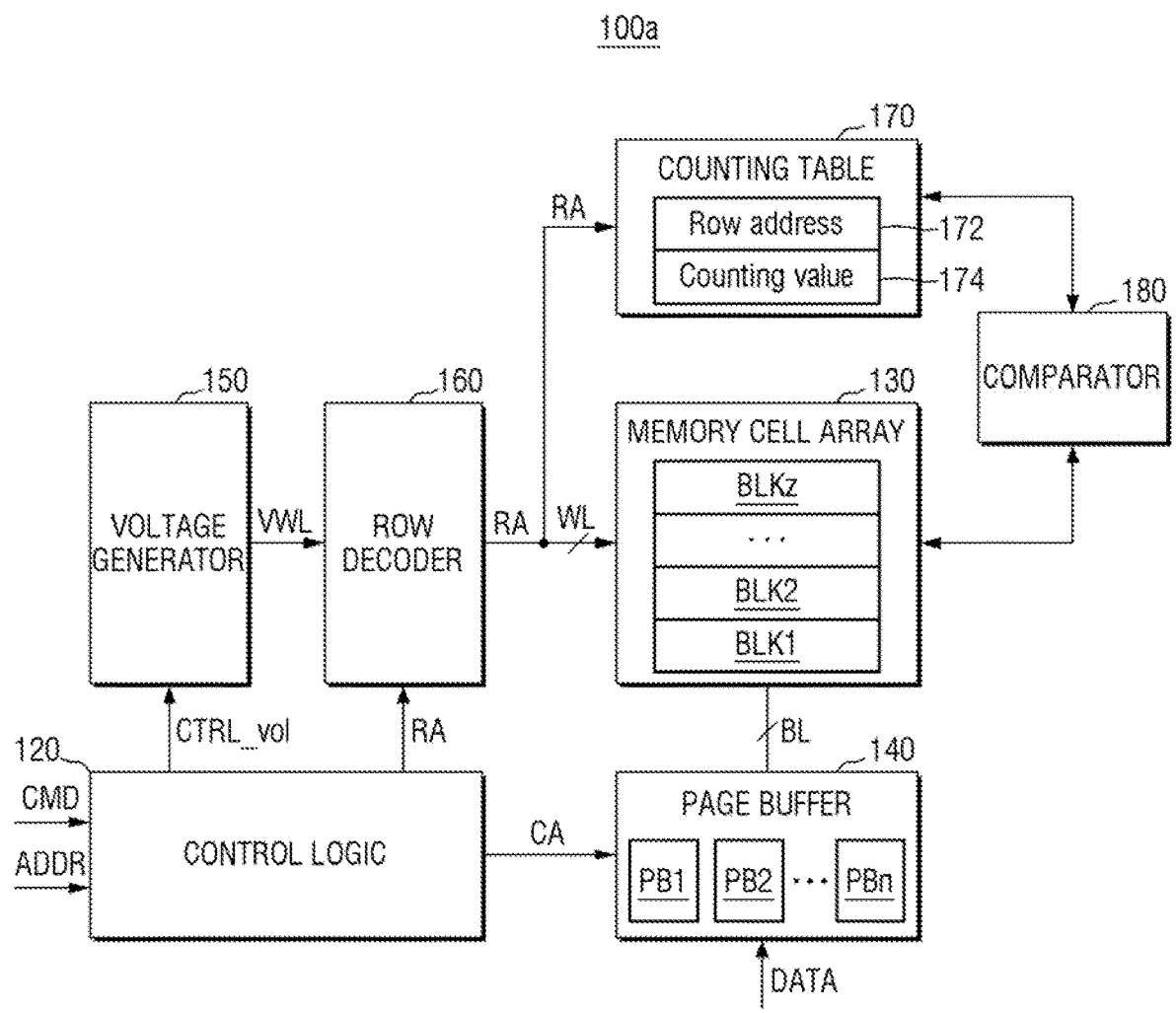
FIG. 1 is a block diagram illustrating a memory device according to some example embodiments.

FIG. 1 is a block diagram illustrating a memory device according to some example embodiments.

Referring to FIG. 1, a memory device 100a according to some example embodiments may include a control logic circuit 120, a memory cell array 130, a page buffer 140, a voltage generator 150, a row decoder 160, a counting table 170, and a comparator 180. Although not shown in FIG. 1, the memory device 100a may further include a memory interface circuit, and may further include a column logic, a pre-decoder, a temperature sensor, a command decoder, an address decoder, and the like.

The control logic circuit 120 may generally control various operations in the memory device 100a. The control logic circuit 120 may output various control signals in response to a command CMD and/or an address ADDR from an external component, e.g., a memory interface circuit. For example, the control logic circuit 120 may output a voltage control signal CTRL_vol, a row address RA, and a column address CA.

The memory cell array 130 may include a plurality of memory blocks BLK1 to BLKz (z is a positive integer). Each of the plurality of memory blocks BLK1 to BLKz may include a plurality of memory cells. The memory cell may be, e.g., a DRAM memory cell. Further description of the memory cells will now be made with reference to FIG. 2.

Figure 2:
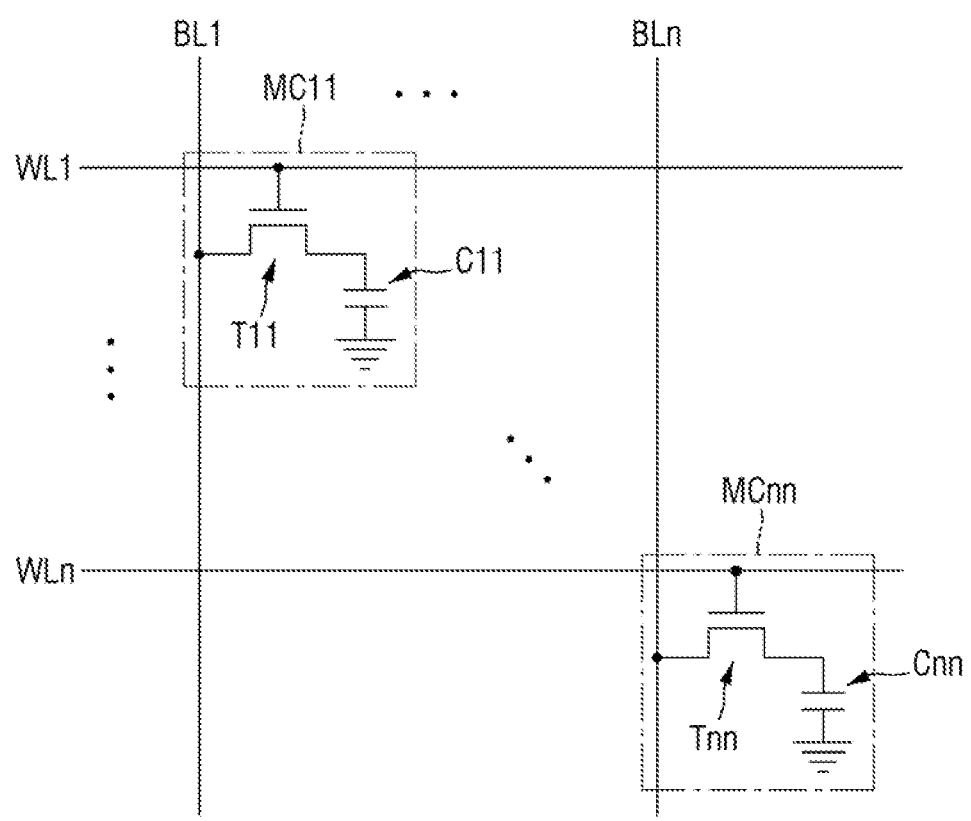
FIG. 2 is an example circuit diagram for illustrating the memory cell of FIG. 1.

FIG. 2 is an example circuit diagram for illustrating the memory cell of FIG. 1.

Referring to FIG. 1 and FIG. 2, each of the plurality of memory blocks BLK1 to BLKz may include a plurality of memory cells (e.g., MC11 to MCnn).

Each of the plurality of memory cells (e.g., MC11 to MCnn) may include one transistor and one capacitor. For example, the memory cell MC11 may include a transistor T11 and a capacitor C11, and the memory cell MCnn may include a transistor Tnn and a capacitor Cnn.

Each of the plurality of memory cells (e.g., MC11 to MCnn) may be connected to one word-line WL and one bit-line BL. For example, the memory cell MC11 may be connected to a first word-line WL1 and a first bit-line BL1. More specifically, a gate of the transistor T11 may be connected to the first word-line WL1, and one end of the transistor T11 may be connected to the first bit-line BL1. The other end of the transistor T11 may be connected to the capacitor C11. In another example, the memory cell MCnn may be connected to an n-th word-line WLn and an n-th bit-line BLn. More specifically, a gate of the transistor Tnn may be connected to the n-th word-line WLn, and one end of the transistor Tnn may be connected to the n-th bit-line BLn. The other end of the transistor Tnn may be connected to the capacitor Cnn.

Each of the plurality of memory cells (e.g., MC11 to MCnn) may store electric charges using the capacitor.

A memory cell array 130 including the memory cells (e.g., MC11 to MCnn), such as a DRAM, may include a plurality of memory banks for storing data. Each of the plurality of memory banks may include a number of memory cells. Each of the memory cells may be composed of each cell transistor (e.g., each of T11 to Tnn) that serves as a switch, and each cell capacitor that stores data (e.g., each of C11 to Cnn), as described above.

In general, a leakage current may occur due to a structure of the memory cell, such as a PN junction of the cell transistor, such that initial data stored in the cell capacitor may be lost. Therefore, the memory device 100a may implement a refresh operation (hereinafter referred to as a 'normal refresh operation') for recharging data in the memory cell before the data in the memory cell is lost. The normal refresh operation may include auto refresh and self refresh.

The auto refresh may refer to a mode in which the memory device 100a performs a refresh operation in response to a refresh command applied from an outside.

The self refresh may refer to a mode in which the memory device 100a performs the refresh operation while sequentially changing an internal address by itself in response to the refresh command applied from the outside.

In addition to the above-described normal refresh operation, an additional refresh operation may be performed on a memory cell of a specific word-line having a high possibility of data loss, e.g., due to row hammering.

Row hammering refers to a phenomenon in which data of a memory cell, connected to a first word-line adjacent to a second word-line having a larger number of times of activations, may be damaged, or suffer data corruption or loss.

In order to prevent damage or data loss due to the row hammering phenomenon, the additional refresh operation may be performed on a word-line that is adjacent to a word-line that is activated a number of times that is greater than or equal to a predefined value. This operation may be referred to as a target-row refresh (TRR) operation.

Referring back to FIG. 1, the memory cell array 130 may be connected to the page buffer 140 through the bit-lines BL, and may be connected to the row decoder 160 through the word-lines WL.

The page buffer 140 may include a plurality of page buffers PB1 to PBn, where n is an integer greater than or equal to 3. The plurality of page buffers PB1 to PBn may be connected to the memory cells via a plurality of bit-lines BL, respectively. The page buffer 140 may select at least one bit-line among from the bit-lines BL in response to a column address CA. The page buffer 140 may operate as a write driver or a sense amplifier depending on an operation mode. For example, during a write operation, the page buffer 140 may apply a bit-line voltage corresponding to data as a write operation target to the selected bit-line. During a read operation, the page buffer 140 may detect data stored in the memory cell based on a detecting result of current or voltage of the selected bit-line.

The voltage generator 150 may generate various voltages for performing read and write operations, based on a voltage control signal CTRL_vol. For example, the voltage generator 150 may generate a read voltage, a write voltage, and/or a refresh voltage as a voltage VWL to be applied to the word-line.

The row decoder 160 may select one of the plurality of word-lines WL in response to a row address RA. For example, during a write operation, the row decoder 160 may apply a write voltage to the selected word-line. During a read operation, the row decoder 160 may apply a read voltage to the selected word-line.

The row address RA generated from the row decoder 160 may be transmitted to the counting table 170. The counting table 170 may store a row address 172 activated in the memory cell array 130. The counting table 170 may store a counting value 174 as the number of times the row address 172 is activated.

For a row hammering mitigation operation (e.g., the target-row refresh operation), a space may be required for storing the counting value 174 of the activation of the row address RA. Thus, the counting value 174 may be stored in the counting table 170. Additionally, the counting value 174 of the counting table 170 may be backed up to the memory cell array 130 via the comparator 180.

The counting table 170 may include, e.g., a register. In another example, the counting table 170 may be disposed in a row hammering mitigation logic circuit, e.g., a target-row refresh circuit. This will now be described with reference to FIG. 3, in connection with a row hammering mitigation logic circuit 176.

Figure 3:
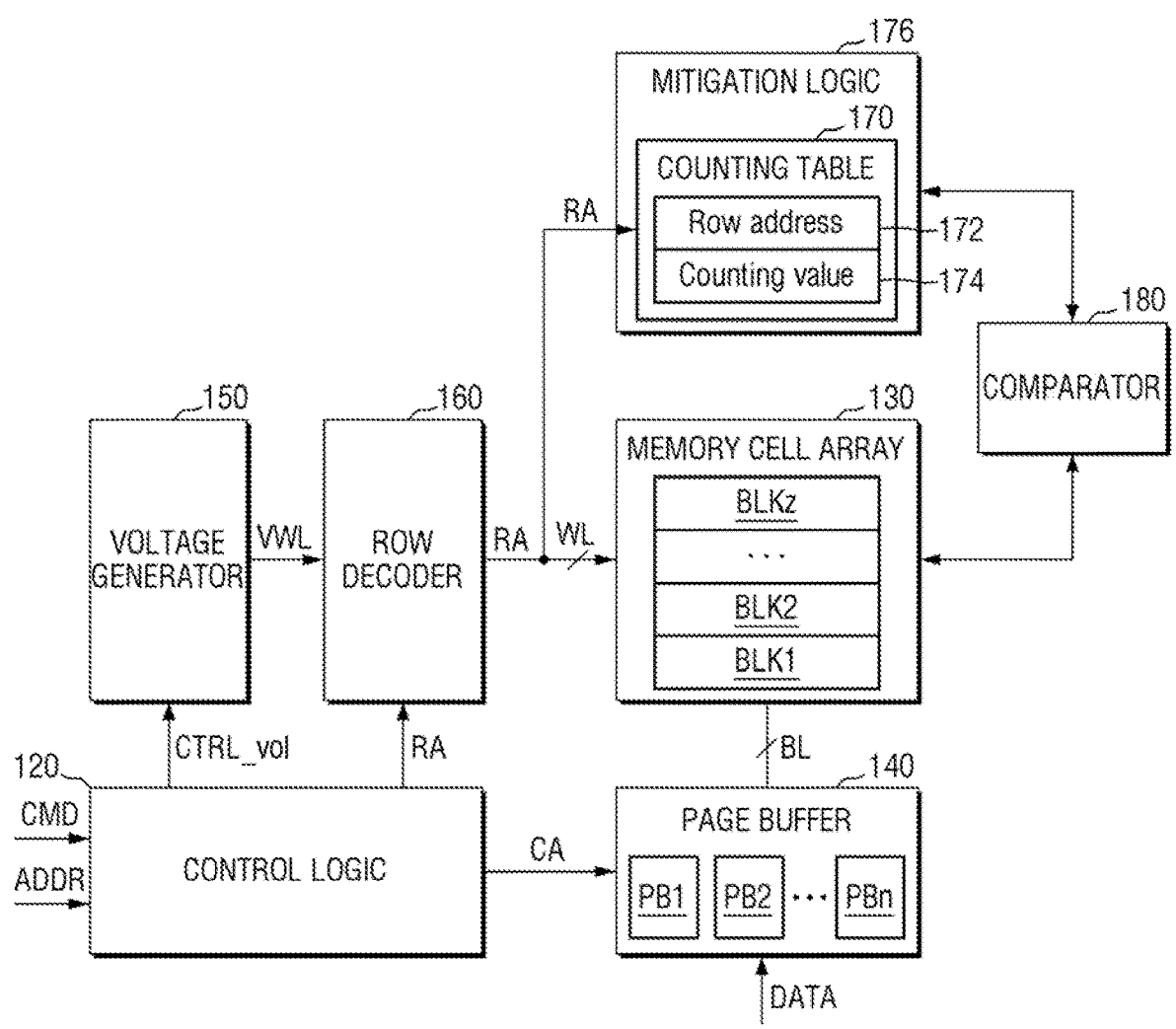
FIG. 3 is a block diagram illustrating another memory device according to some example embodiments.

FIG. 3 is a block diagram illustrating another memory device according to some example embodiments.

Referring to FIG. 3, a memory device 100b according to some example embodiments further includes the row hammering mitigation logic circuit 176.

The row hammering mitigation logic circuit 176 may be, e.g., a circuit that performs the normal refresh operation and/or performs the target-row refresh operation.

The row hammering mitigation logic circuit 176 may perform an additional refresh operation on a memory cell of a specific word-line having a high probability of losing data. For example, the row hammering mitigation logic circuit 176 may perform an additional refresh operation of a row address corresponding to a word-line that is activated the number of times that is larger than equal to a predefined value, with reference to the counting table 170.

In the memory device 100b, the counting table 170 may be stored in the row hammering mitigation logic circuit 176. In another implementation, in the memory device 100a, the counting table 170 may be stored in a separate storage space, e.g., a register, In general, as a number of row addresses 172 stored in the counting table 170 increases (and thus, the counting value 174 corresponding thereto also increases), some row addresses 172 may be excluded from the counting table 170 due to a limited space of the counting table 170, in which case information about the counting value 174 corresponding to the corresponding row address 172 may be lost. Accordingly, the memory device according to some example embodiments may back up some of the counting values 174 stored in the counting table 170 to some of memory cells in the memory cell array 130. Thus, the loss of the information about the row address 172 and the related counting value 174 may be prevented, and thus reliability of the row hammering mitigation operation may be improved. Description thereof will now be made in detail below.

FIG. 4 is an example block diagram for illustrating a block of FIG. 1.

Referring to FIG. 1 and FIG. 4, each of blocks in the memory cell array 130 includes a plurality of word-lines WL1 to WLn. Hereinafter, a first block BLK1 will be described by way of example. It will be appreciated that the description of the first block BLK1 may also be applied to remaining second to z-th blocks BKL2 to BLKz.

Each of the plurality of word-lines WL1 to WLn may correspond to each of a plurality of row addresses RA1 to RAn. For example, a word-line activated via the first row address RA1 may be the first word-line WL1, and a word-line activated via the n-th row address RAn may be the n-th word-line WLn. In connection with this, n is a natural number.

Each of the plurality of word-lines WL1 to WLn may be connected to a plurality of memory cells, as illustrated in FIG. 2. The plurality of memory cells connected a word-line WL may include a data region 132, in which data is stored, and a counting value backup region 134, in which the number of times the WL is activated is backed up. For example, each DRAM row of a plurality of DRAM rows may include the data region 132 and the counting value backup region 134.

FIG. 4 shows that the backed-up counting values 136a to 136n of all word-lines WL1 to WLn (stored in the counting value backup region 134, and storing or backing up the number of times each of the plurality of word-lines WL1 to WLn is activated) have the same size. However, the backed-up counting values 136a to 136n of the plurality of word-lines WL1 to WLn may have different sizes.

The counting value backup region 134 may contain therein, e.g., the first backed-up counting value 136a (as a backed up value of the number of activations of the first word-line WL1), and the n-th backed-up counting value 136n (as a backed up value of the number of activations of the n-th word-line WLn). Thus, the counting value backup region 134 may contain therein each of the plurality of backed-up counting values 136 as information about the number of times each of the plurality of word-lines WL1 to WLn is activated.

In connection with this, the counting value 136 to be backed up may be transmitted from the counting table 170, and then may be backed up to the counting value backup region 134. An operation in which the counting value 174 from the counting table 170 is backed up to the counting value backup region 134 will now be described in detail below.

FIG. 5 is an example block diagram for illustrating the counting table.

Referring to FIG. 4 and FIG. 5, the counting table 170 may store therein, e.g., 6 row addresses RA1, RA3, RA7, RA9, RAn-1, and RAn and 6 counting values 174a, 174c, 174g, 174i, 174n-1, and 174n, which respectively correspond to the row addresses RA1, RA3, RA7, RA9, RAn-1, and RAn. This information stored in the counting table 170 is merely an example, and thus, the numbers and types of the row addresses stored in the counting table 170 and the counting values corresponding thereto may be varied.

At least some of the row addresses RA1, RA3, RA7, RA9, RAn-1, and RAn and at least some of the counting values 174a, 174c, 174g, 174i, 174n-1, and 174n corresponding to the row addresses RA1, RA3, RA7, RA9, RAn-1, and RAn as stored in the counting table 170 may be backed up in corresponding counting value backup regions 134. This will now be described based on FIG. 6.

Figure 6:
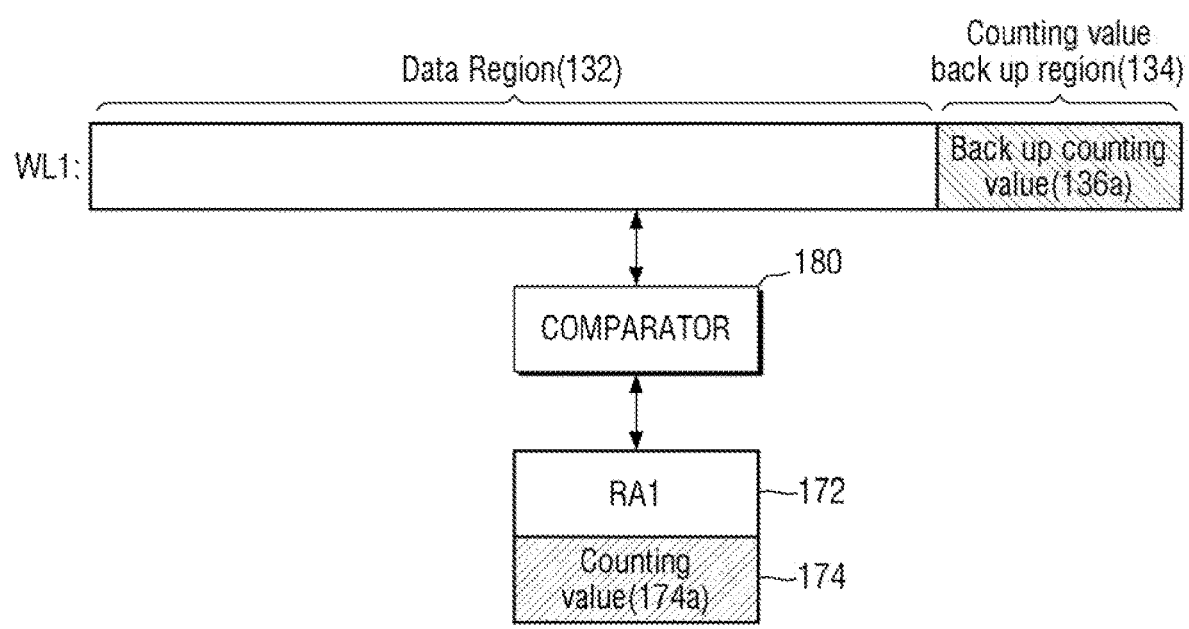
FIG. 6 is an example diagram for illustrating an operation of a comparator according to some example embodiments.

FIG. 6 is an example diagram for illustrating an operation of a comparator according to some example embodiments.

Referring to FIG. 5 and FIG. 6, as an example it is assumed that the counting value 174a corresponding to the first row address RA1 of the counting table 170 is backed up in a corresponding counting value backup region 134. In connection with this, the counting value 174a may be backed up to a counting value backup region 134 corresponding to the first word-line WL1 (activated by the first row address RA1 corresponding to the counting value 174a) through the comparator 180. Thus, the counting value 174a may be stored from the counting table 170 to the counting value backup region 134 through the comparator 180.

In connection with this, the comparator 180 may compare the counting value 174 of the counting table 170 with the backed-up counting value 136 stored in the counting value backup region 134, and perform the backup thereof based on the comparing result.

For example, the comparator 180 may compare the counting value 174 (stored in the counting table 170) with the backed-up counting value 136 (stored in the counting value backup region 134). When the counting value 174 of the counting table 170 has a value greater than the backed-up counting value 136, the counting value 174 of the counting table 170 may be backed up in the counting value backup region 134. Conversely, when the backed-up counting value 136 stored in the counting value backup region 134 has a value greater than the counting value 174 of the counting table 170, the backed-up counting value 136 may be stored in the counting table 170.

The above-described operation will now be described based on flowcharts of FIG. 7 to FIG. 10.

FIG. 7 to FIG. 10 are flowcharts for illustrating an operation of a memory device according to some example embodiments.

Referring to FIG. 1, FIG. 4, FIG. 5, and FIG. 7, an operation S10*a* of the memory device according to some example embodiments will now be described.

First, the comparator 180 compares a backed-up counting value 136*n* (stored in the counting value backup region 134 and corresponding to the n-th row address RAn) with the counting value 174*n* (corresponding the n-th row address RAn of the counting table 170), in S110.

In connection with this, the comparator 180 determines whether the backed-up counting value 136*n* (stored in the counting value backup region 134 and corresponding to the n-th row address RAn) is greater than the counting value 174*n* (corresponding to the n-th row address RAn of the counting table 170), in S120.

When it is determined that the backed-up counting value 136*n* (stored in the counting value backup region 134 and corresponding to the n-th row address RAn) is greater than the counting value 174*n* (corresponding to the n-th row address RAn of the counting table 170) (S120, Y), the comparator overwrites the backed-up counting value 136*n* (stored in the counting value backup region 134 and corresponding to the n-th row address RAn) onto the counting value 174*n* (corresponding to the n-th row address RAn of the counting table 170), in S130.

On the other hand, when it is determined that the backed-up counting value 136*n* (stored in the counting value backup region 134 and corresponding to the n-th row address RAn) is not greater than the counting value 174*n* (corresponding to the n-th row address RAn of the counting table 170) (S120, N), the comparator 180 determines whether the counting value 174*n* (corresponding to the n-th row address RAn of the counting table 170) is greater than the backed-up counting value 136*n* stored in the counting value backup region 134 and corresponding to the n-th row address RAn, in S140.

When it is determined that the counting value 174*n* (corresponding to the n-th row address RAn of the counting table 170) is greater than the backed-up counting value 136*n* (stored in the counting value backup region 134 and corresponding to the n-th row address RAn) (S140, Y), the comparator 180 backs up the counting value 174*n* (corresponding to the n-th row address RAn of the counting table 170) into the counting value backup region 134 corresponding to the n-th row address in RAn S150.

After the above-described overwrite operation S130 and the above-described backup operation S150, it may be determined that the row hammering mitigation operation is necessary. In this case, the row hammering mitigation operation may be performed.

Figure 7:
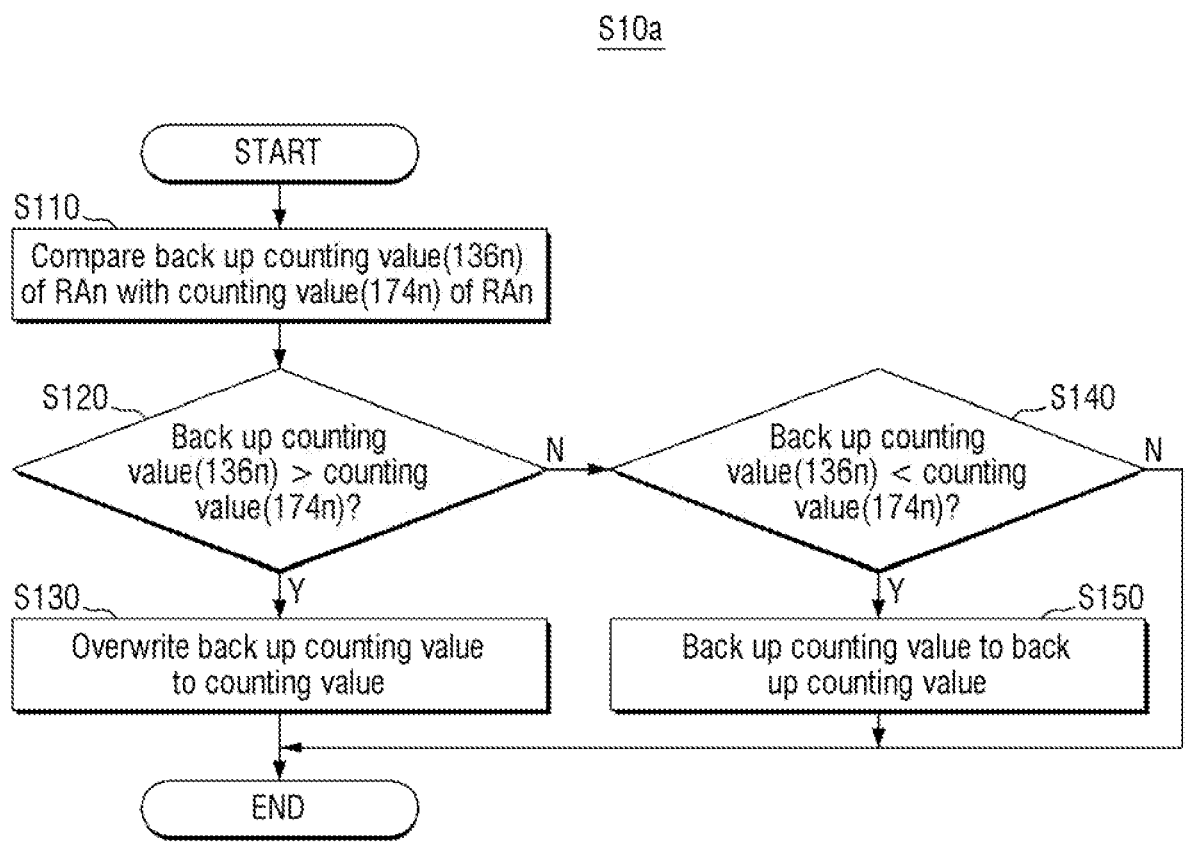
FIG. 7 to FIG. 10 are flowcharts for illustrating an operation of a memory device according to some example embodiments.
Figure 8:
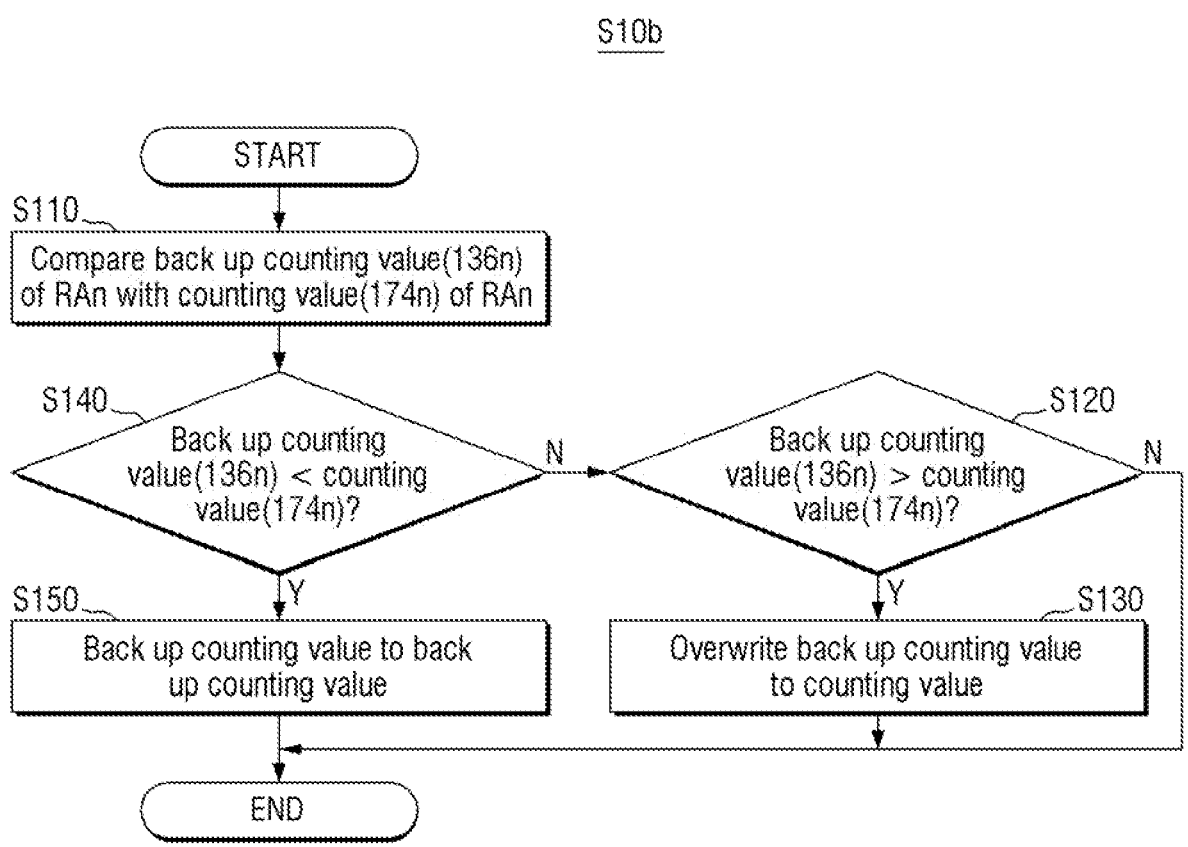

The operation of the memory device according to some example embodiments may be varied from FIG. 7 described above, as will now be described. Aspects of the above descriptions not explicitly described below may be assumed to be the same as described above, to thus simplify description and avoid repetition.

Referring to FIG. 1, FIG. 4, FIG. 5, and FIG. 8, an operation S10*b* of the memory device according to some example embodiments will now be described.

After the comparison operation S110, the comparator 180 may first determine whether the counting value 174*n* corresponding to the n-th row address RAn of the counting value backup region 134 is greater than the backed-up counting value 136*n* stored in the counting value backup region 134 and corresponding to the n-th row address RAn, in S140.

Subsequent operations are the same as those as described above based on FIG. 7, and thus descriptions thereof are omitted.

Next, embodiments will be described that may be implemented to prevent a decrease in a proportion of the data region 132 (e.g., a size of the data region 132 relative to the counting value backup region 134; see FIG. 4). The comparator 180 may compare the counting value 174 of the counting table 170 with the backed-up counting value 136 stored in the counting value backup region 134, and then perform the overwrite or backup operation only when a difference therebetween is greater than a threshold value.

In this regard, an operation of the memory device according to some example embodiments, in which the comparator 180 compares the counting value 174 of the counting table 170 with the backed-up counting value 136 stored in the counting value backup region 134, and performs the overwrite or backup operation only when a difference therebetween is greater than the threshold value, will now be described with reference to FIG. 9 and FIG. 10.

Referring to FIG. 1, FIG. 4, FIG. 5, and FIG. 9, an operation S10*c* of the memory device according to some example embodiments, which is different from operation S10*a* of FIG. 7, will now be described.

In operation S10*c*, the comparator 180 determines whether the backed-up counting value 136*n* (stored in the counting value backup region 134 and corresponding to the n-th row address RAn) is greater than a value obtained by adding the threshold value to the counting value 174*n* (corresponding to the n-th row address RAn of the counting table 170), in S122.

When it is determined that the backed-up counting value 136*n* (stored in the counting value backup region 134 and corresponding to the n-th row address RAn) is greater than the value obtained by adding the threshold value to the counting value 174*n* (corresponding to the n-th row address RAn of the counting table 170) (S122, Y), the comparator 180 overwrites the backed-up counting value 136*n* (stored in the counting value backup region 134 and corresponding to the n-th row address RAn) onto the counting value 174*n* (corresponding to the n-th row address RAn of the counting table 170), in S130.

On the other hand, when it is determined that the backed-up counting value 136*n* (stored in the counting value backup region 134 and corresponding to the n-th row address RAn) is not greater than the value obtained by adding the threshold value to the counting value 174*n* (corresponding to the n-th row address RAn of the counting table 170) (S122, N), the comparator 180 determines whether the counting value 174n (corresponding to the n-th row address RAn of the counting table 170) is greater than a value obtained by adding the threshold value to the backed-up counting value 136n stored in the counting value backup region 134 and corresponding to the n-th row address RAn, in S142.

Subsequent operations are similar to those as described above based on FIG. 7, and thus descriptions thereof are omitted.

Referring to FIG. 1, FIG. 4, FIG. 5, and FIG. 10, in an operation S10d of the memory device according to some embodiments, after the comparison operation S110, the comparator 180 may first determine whether the counting value 174n (corresponding to the n-th row address RAn of the counting table 170) is greater than the value obtained by adding the threshold value to the backed-up counting value 136n stored in the counting value backup region 134 and corresponding to the n-th row address RAn, in S142.

Subsequent operations are the same as those described above based on FIG. 8, and thus descriptions thereof are omitted.

Figure 11:
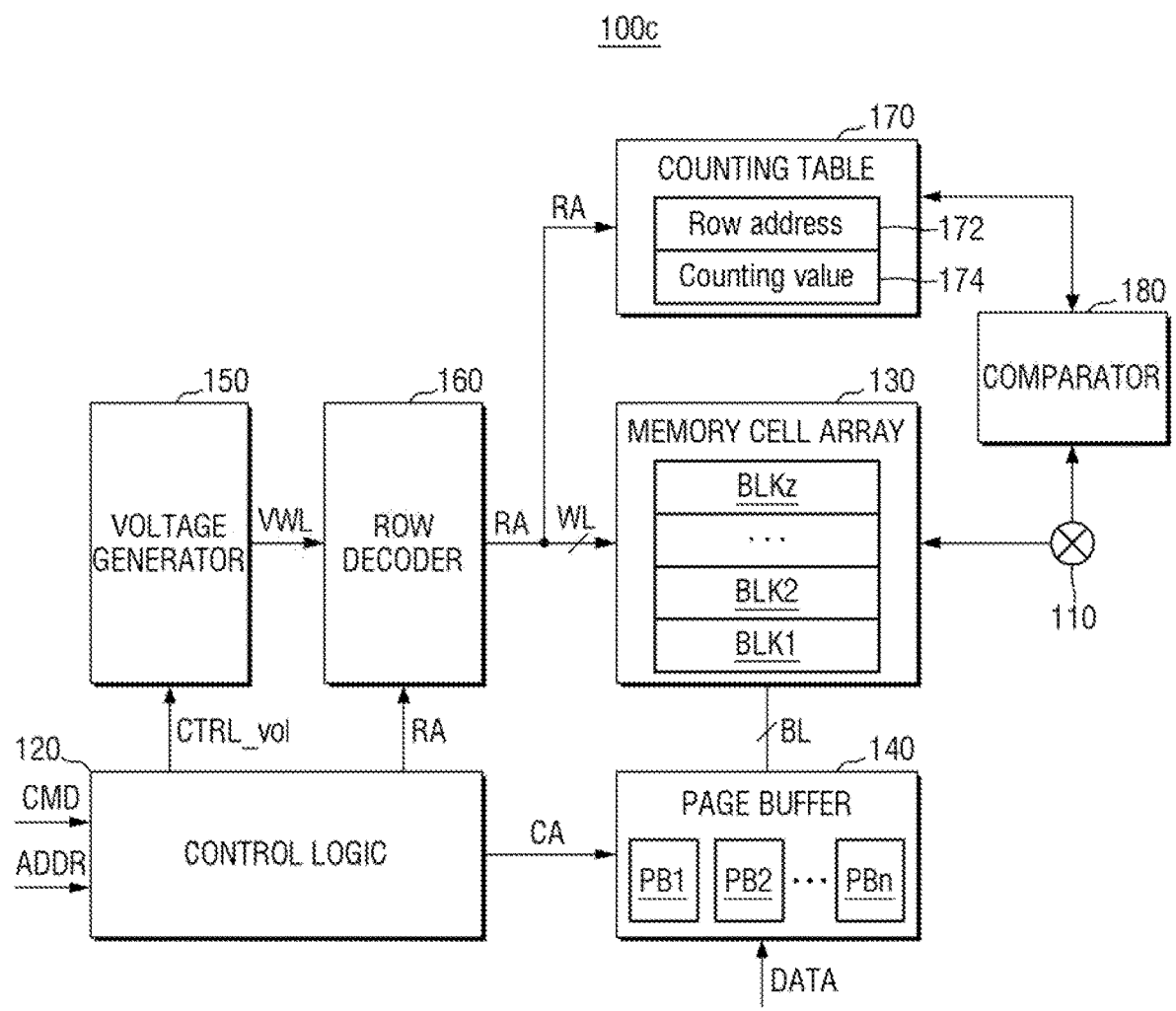
FIG. 11 is a block diagram illustrating another memory device according to some example embodiments

FIG. 11 is a block diagram illustrating another memory device according to some example embodiments. Hereinafter, repeated descriptions of the above descriptions are omitted for simplicity of description.

Referring to FIGS. 4 and 11, a memory device 100c according to some example embodiments further includes a multiplier 110 disposed between the memory cell array 130 and the comparator 180, relative to the configuration of the memory device 100a of FIG. 1.

Figure 9:
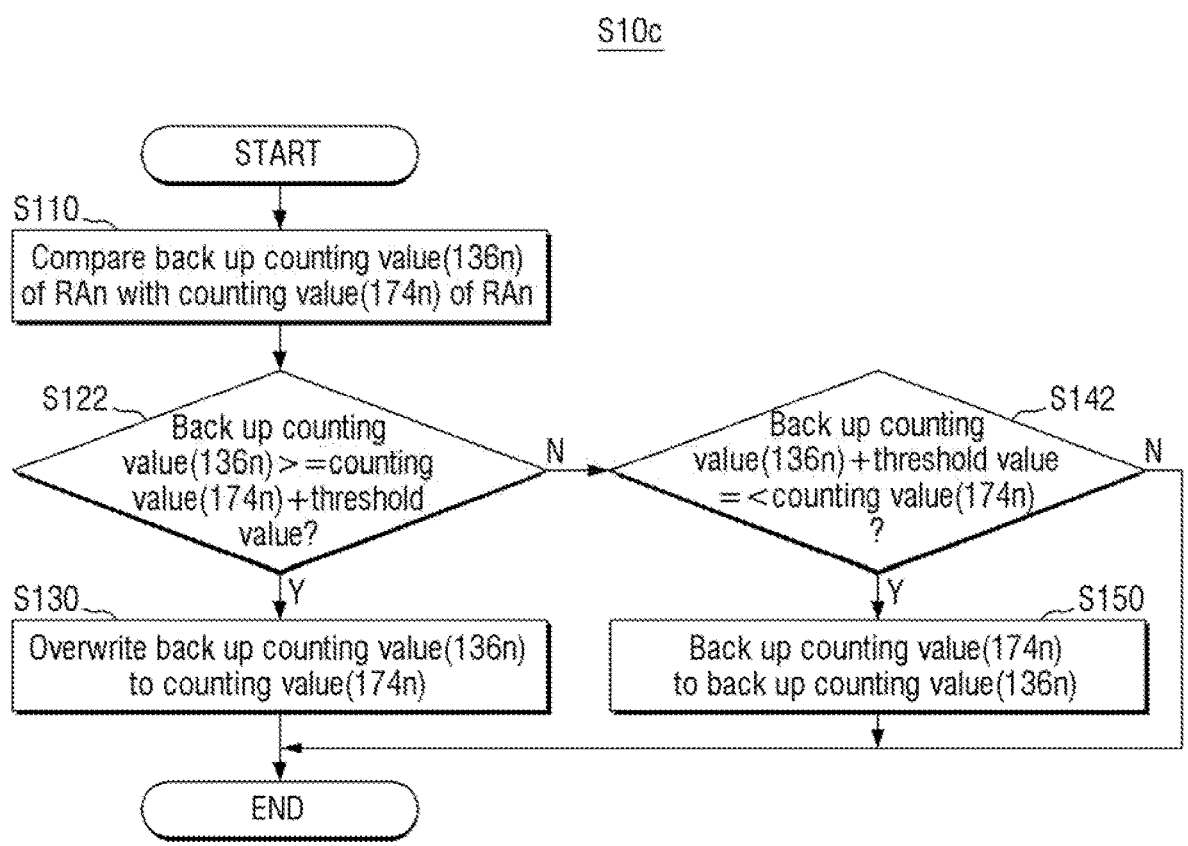
Figure 10:
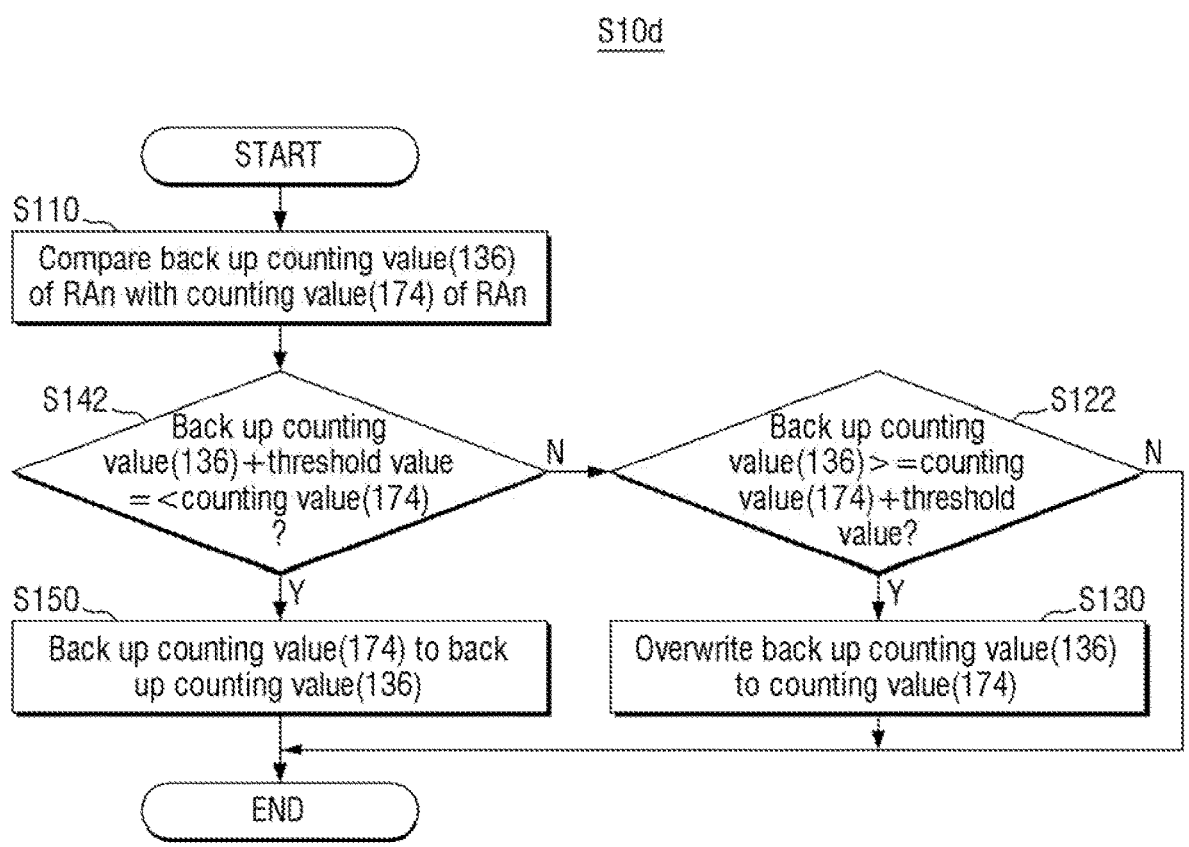

Relative to the description provided above in connection with FIG. 9 and FIG. 10, when the comparator 180 determines whether to perform the overwrite or backup operation based on the threshold value, the multiplier 110 may be used to reduce a size of the backed-up counting value 136 that is backed up in the counting value backup region 134. This will now be described in detail based on FIG. 12.

Figure 12:
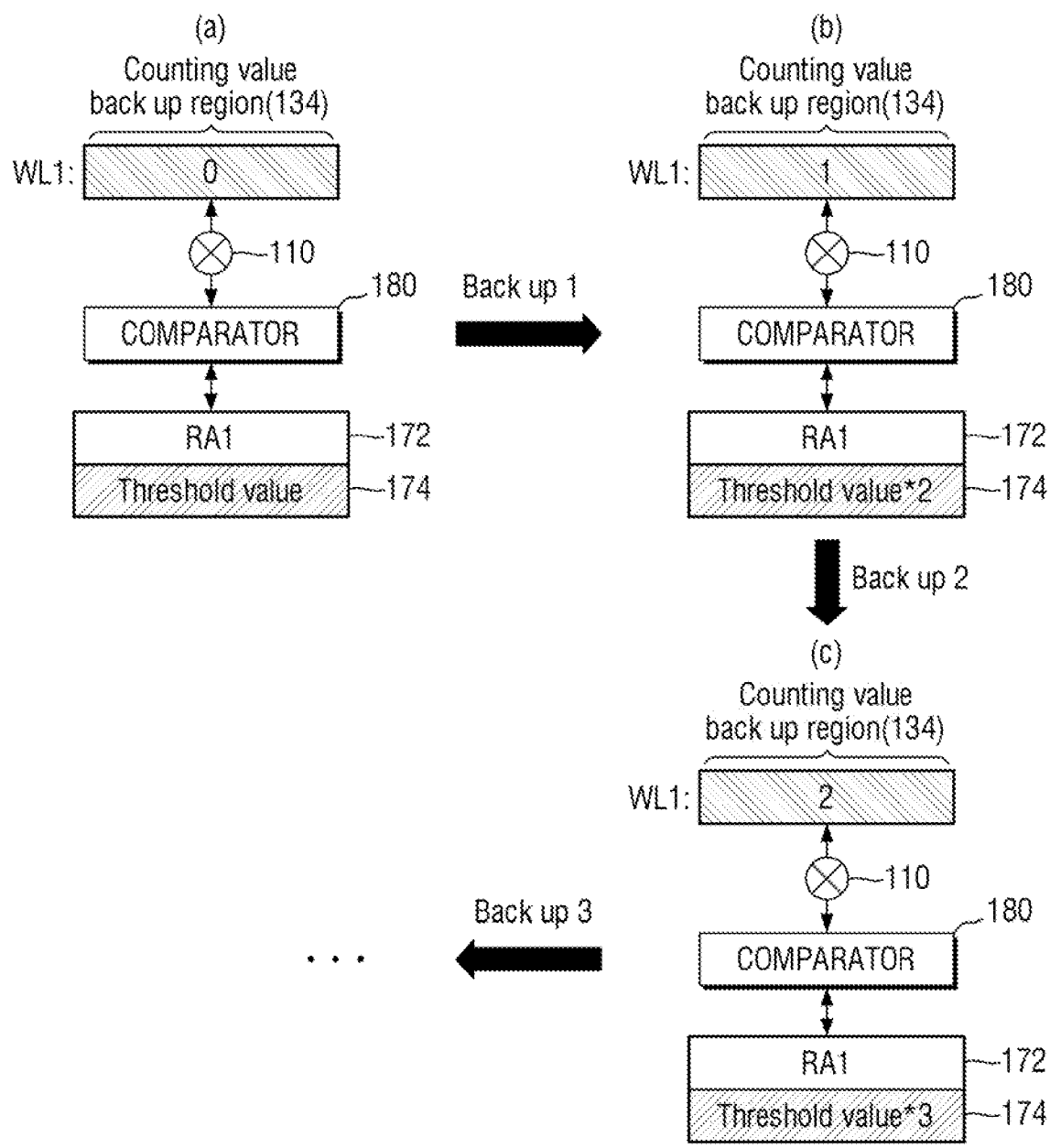
FIG. 12 is an example diagram for illustrating an operation using a multiplier of a memory device according to some example embodiments.

FIG. 12 is an example diagram for illustrating an operation using a multiplier of a memory device according to some example embodiments.

Referring to FIG. 4, FIG. 11 and FIG. 12, a first row address RA1 and a corresponding counting value are described by way of example.

First, it is assumed that in a state (a), the backed-up counting value stored in the counting value backup region 134 (as the number of times the first word-line WL1 is activated based on the first row address RA1) is "0". Further, it is assumed that the counting value 174 (corresponding to the first row address RA1 and stored in the counting table 170) is the threshold value. The threshold value may be a positive integer.

The multiplier 110 multiplies the backed-up counting value 136a "0" corresponding to the first word-line WL1 by the threshold value, and transmits the multiplying result to the comparator 180.

The comparator 180 compares the value obtained by multiplying the backed-up counting value 136a corresponding to the first word-line WL1 by the threshold value with the counting value 174 stored in the counting table 170.

Thus, the comparator 180 determines whether a difference between the value obtained by multiplying the backed-up counting value 136a corresponding to the first word-line WL1 by the threshold value and the counting value 174 stored in the counting table 170 is greater than or equal to the threshold value.

For example, because the counting value 174 stored in the counting table 170, i.e., the threshold value, is greater than or equal to a sum (0+threshold value=threshold value) of the threshold value and the value (0*threshold value=0) obtained by multiplying the backed-up counting value 136a "0" corresponding to the first word-line WL1 by the threshold value, the comparator 180 may back up the counting value 174 stored in the counting table 170, i.e., the threshold value, into the counting value backup region 134 corresponding to the first word-line WL1.

In connection with this, the multiplier 110 stores "1" as an integer of an integer multiple of the threshold value in the counting value backup region 134 corresponding to the first word-line WL1.

Thus, instead of backing up the threshold value as the counting value 174 stored in the counting table 170 in the state (a) into the counting value backup region 134 corresponding to the first word-line WL1, the comparator may back up "1" as an integer of an integer multiple of the threshold value. This may reduce a size of the counting value backup region 134 to thereby correspondingly increase a size of the data region 132.

In a state (b) where "1" is backed up into the counting value backup region 134 corresponding to the first word-line WL1, it is assumed that the counting value 174 corresponding to the first row address RA1 and stored in the counting table 170 is the threshold value*2.

The multiplier 110 multiplies the backed-up counting value 136a "1" corresponding to the first word-line WL1 by the threshold value, and transmits the multiplying result to the comparator 180.

The comparator 180 compares the value obtained by multiplying the backed-up counting value "1" corresponding to the first word-line WL1 by the threshold value with the counting value "threshold value*2" stored in the counting table 170.

Thus, the comparator 180 determines whether a difference between the value obtained by multiplying the backed-up counting value "1" corresponding to the first word-line WL1 by the threshold value and the counting value "threshold value*2" stored in the counting table 170 is greater than or equal to the threshold value.

For example, because the counting value "threshold value*2" stored in the counting table 170 is greater than or equal to a sum (threshold value+threshold value=threshold value*2) of the threshold value and the value (1*threshold value=threshold value) obtained by multiplying the backed-up counting value "1" corresponding to the first word-line WL1 by the threshold value, the comparator 180 may back up the counting value "threshold value*2" stored in the counting table 170 in the counting value backup region 134 corresponding to the first word-line WL1.

In connection with this, the multiplier 110 stores "2" as an integer of an integer multiple of the threshold value in the counting value backup region 134 corresponding to the first word-line WL1.

Thus, the counting value "threshold value*2" stored in the counting table 170 in the state (b) is not backed up into the counting value backup region 134 corresponding to the first word-line WL1, but "2" as an integer of an integer multiple of the threshold value is backed up into the counting value backup region 134 corresponding to the first word-line WL1. This may reduce a size of the counting value backup region 134 to correspondingly increase a size of the data region 132.

In a state (c) where "2" is backed up into the counting value backup region 134 corresponding to the first word-line WL1, it is assumed that the counting value 174 corresponding to the first row address RA1 and stored in the counting table 170 is the threshold value*3.

The multiplier 110 multiplies the backed-up counting value "2" corresponding to the first word-line WL1 by the threshold value, and transmits the multiplying result to the comparator 180.

The comparator 180 compares the value obtained by multiplying the backed-up counting value "2" corresponding to the first word-line WL1 by the threshold value with the counting value "threshold value*3" stored in the counting table 170.

Thus, the comparator 180 determines whether a difference between the value obtained by multiplying the backed-up counting value "2" corresponding to the first word-line WL1 by the threshold value and the counting value "threshold value*3" stored in the counting table 170 is greater than or equal to the threshold value.

For example, because the counting value "threshold value*3" stored in the counting table 170 is greater than or equal to a sum (2*threshold value+threshold value=threshold value*3) of the threshold value and the value (2*threshold value) obtained by multiplying the backed-up counting value "2" corresponding to the first word-line WL1 by the threshold value, the comparator 180 may back up the counting value "threshold value*3" stored in the counting table 170 in the counting value backup region 134 corresponding to the first word-line WL1.

In connection with this, the multiplier 110 stores "3" as an integer of an integer multiple of the threshold value in the counting value backup region 134 corresponding to the first word-line WL1.

Thus, instead of backing up the counting value "threshold value*3" stored in the counting table 170 in the state (c) to the counting value backup region 134 corresponding to the first word-line WL1, "3" as an integer of an integer multiple of the threshold value is backed up into the counting value backup region 134 corresponding to the first word-line WL1. This may reduce a size of the counting value backup region 134 to correspondingly increase a size of the data region 132.

As described above, in the memory device according to some example embodiments, the above-described operation using the comparator 180 and the multiplier 110 may allow for reducing a size of the backed-up counting value 136 stored in the counting value backup region 134 of the memory cell array. This may further increase the proportion of the data region 132 of the memory cell array.

Hereinafter, the above operations will be further described based on flowcharts of FIG. 13 and FIG. 14.

Figure 13:
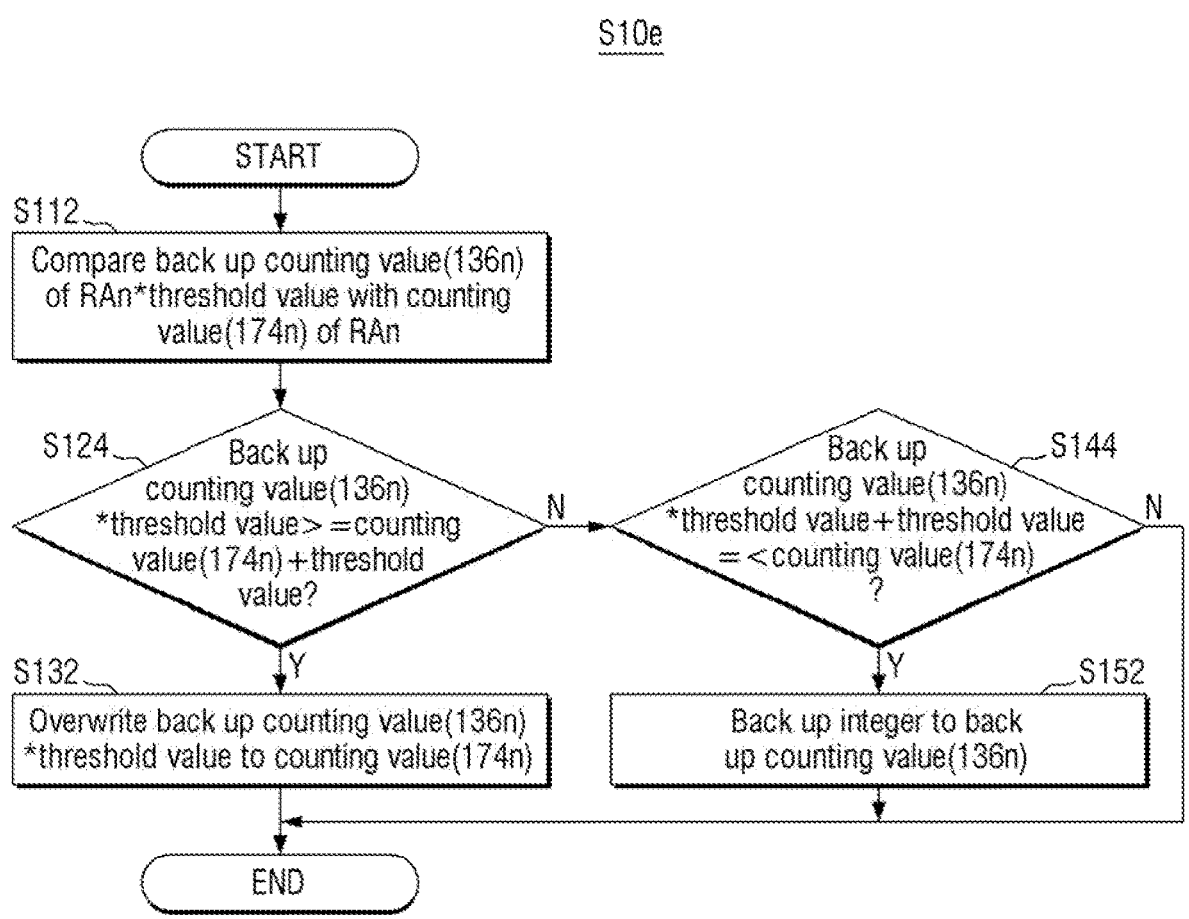
FIG. 13 and FIG. 14 are flowcharts for illustrating operations of a memory device according to some example embodiments.
Figure 14:
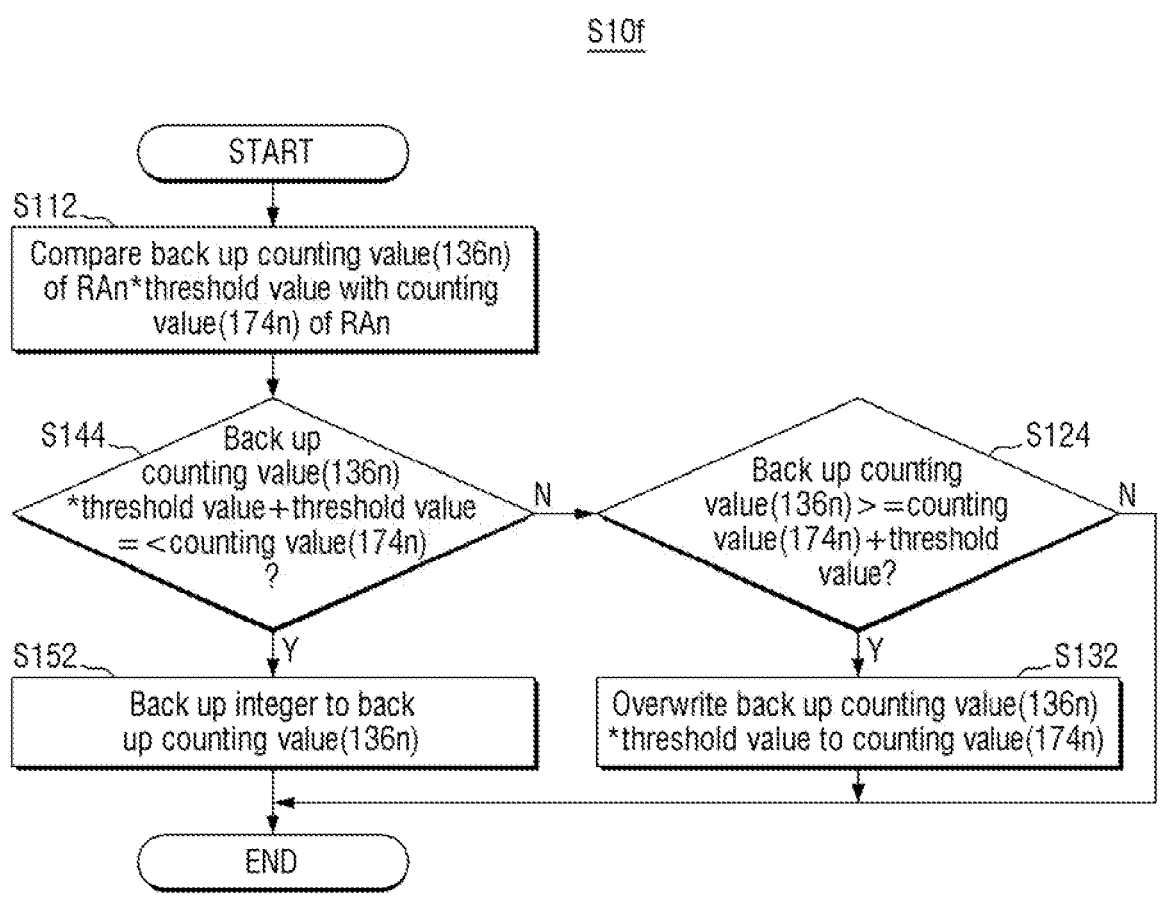

FIG. 13 and FIG. 14 are flowcharts for illustrating operations of a memory device according to some example embodiments.

Referring to FIG. 11 to FIG. 13, an operation S10e of the memory device according to some example embodiments will now be described.

In operation S10e, the comparator 180 compares a value obtained by multiplying the backed-up counting value (stored in the counting value backup region 134 and corresponding to the n-th word-line WLn activated by the n-th row address RAn, and received through the multiplier 110) by the threshold value with the counting value 174 (corresponding to the n-th row address RAn and stored in the counting table 170), in S112.

In connection with this, the comparator 180 determines whether a value obtained by multiplying the backed-up counting value 136n (corresponding to the n-th word-line WLn) by the threshold value is equal to or greater than a value obtained by adding the threshold value to the counting value 174n stored in the counting table 170, in S124.

When it is determined that the value obtained by multiplying the backed-up counting value 136n (corresponding to the n-th word-line WLn) by the threshold value is greater than or equal to the value obtained by adding the threshold value to the counting value 174n stored in the counting table 170 (S124, Y), the comparator 180 overwrites the value obtained by multiplying the backed-up counting value 136n (corresponding to the n-th word-line WLn) by the threshold value onto the counting value 174n stored in the counting table 170, in S132.

On the other hand, when it is determined that the value obtained by multiplying the backed-up counting value 136n (corresponding to the n-th word-line WLn) by the threshold value is smaller than the value obtained by adding the threshold value to the counting value 174n stored in the counting table 170 (S124, N), the comparator 180 determines whether the counting value 174n stored in the counting table 170 is greater than or equal to a value obtained by adding the threshold value to the value obtained by multiplying the backed-up counting value 136n (corresponding to the n-th word-line WLn) by the threshold value, in S144.

When the counting value 174n stored in the counting table 170 is greater than or equal to the value obtained by adding the threshold value to the value obtained by multiplying the backed-up counting value 136n (corresponding to the n-th word-line WLn) by the threshold value (S144, Y), the comparator 180 backs up an integer obtained by dividing a difference between the counting value 174n stored in counting table 170 and the value obtained by multiplying the backed-up counting value 136n (corresponding to the n-th word-line WLn) by the threshold value by the threshold value into the backed-up counting value 136n corresponding to the n-th word-line WLn, in S152.

After the overwrite operation S132 and the backup operation S152, when it is determined that the row hammering mitigation operation is necessary, the row hammering mitigation operation may be performed.

Referring to FIG. 11, FIG. 12 and FIG. 14, an operation S10f of the memory device according to some example embodiments will now be described.

Operation S10f is different from operation S10e of the memory device of FIG. 13 in that, after the comparison operation S112, the comparator 180 may first determine whether the counting value 174n stored in the counting table 170 is greater than or equal to a value obtained by adding the threshold value to the value obtained by multiplying the backed-up counting value 136n (corresponding to the n-th word-line WLn) by the threshold value, in S144.

The subsequent operations are similar to those described based on FIG. 13, and thus descriptions thereof are omitted.

Figure 15:
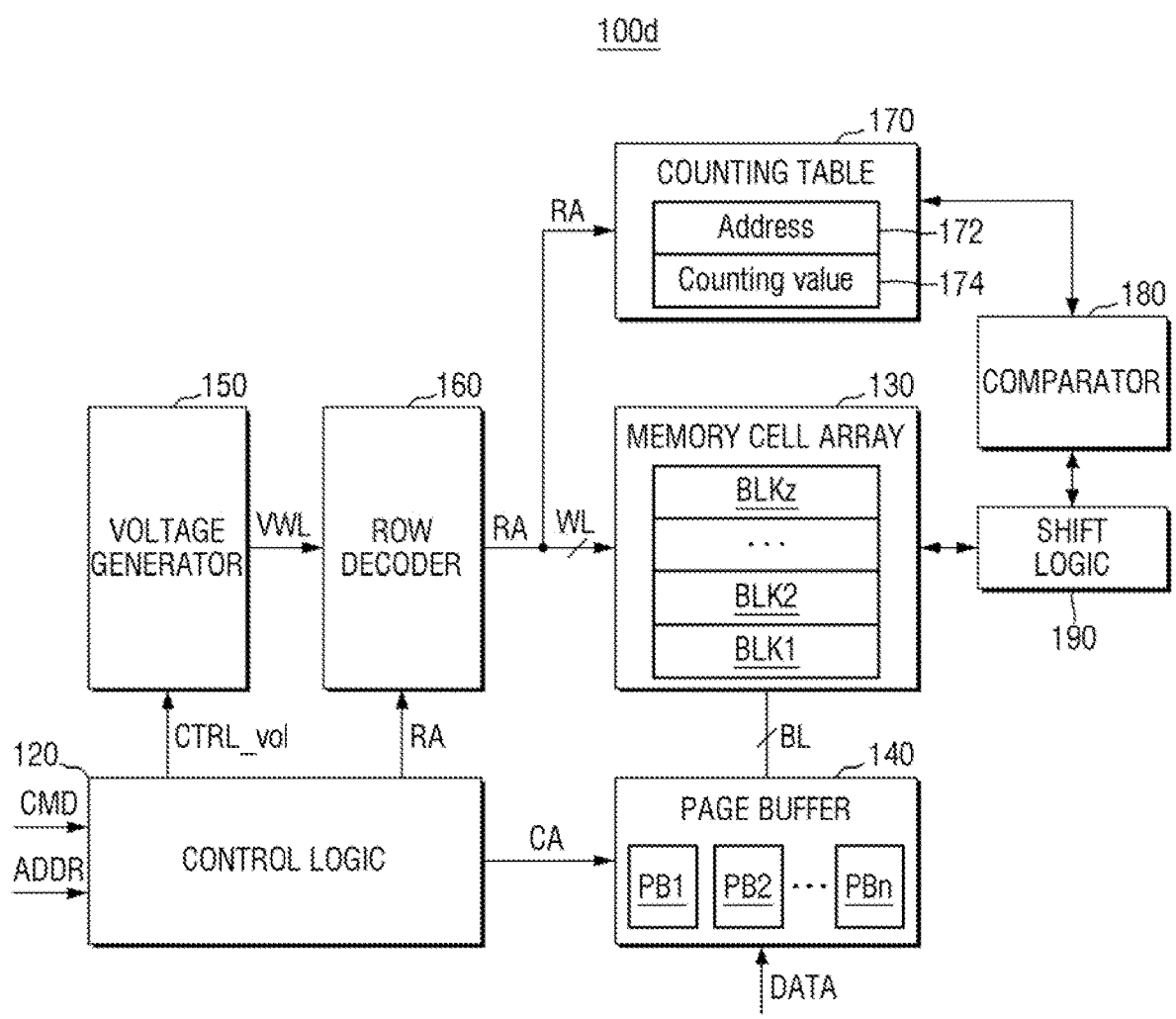
FIG. 15 is a block diagram illustrating another memory device according to some example embodiments.

FIG. 15 is a block diagram illustrating another memory device according to some example embodiments.

Referring to FIGS. 4 and 15, a memory device 100d according to some example embodiments further includes a shift logic circuit 190 disposed between the memory cell array 130 and the comparator 180, relative to the configuration of the memory device 100a of FIG. 1.

In an operation of the memory device 100d according to some example embodiments, the threshold value may be set to a $k^{th}$ power of 2, i.e., $2^k$ (k is a natural number).

In connection with this, the shift logic circuit 190 may shift binary digits of the backed-up counting value 136 stored in the counting value backup region 134 in the memory cell array 130 by $\log_2^{threshold\ value} = \log_2^{2^k} = k$ digits. Thus, when transferring the backed-up counting value 136

(in which an integer multiple value as an integer of an integer multiple of the threshold value is stored) to the comparator, the shift logic circuit 190 may shift binary digits of the backed-up counting value 136 by $\log_2^{threshold\ value} = \log_2^{2^k} = k$ digits. Thus, the operation of the memory device 100d may be performed more simply than the operation of the memory device including the multiplier 110 in FIG. 11.

The operation of the memory device 100d using the shift logic circuit 190 will now be described in detail with reference to FIG. 16.

Figure 16:
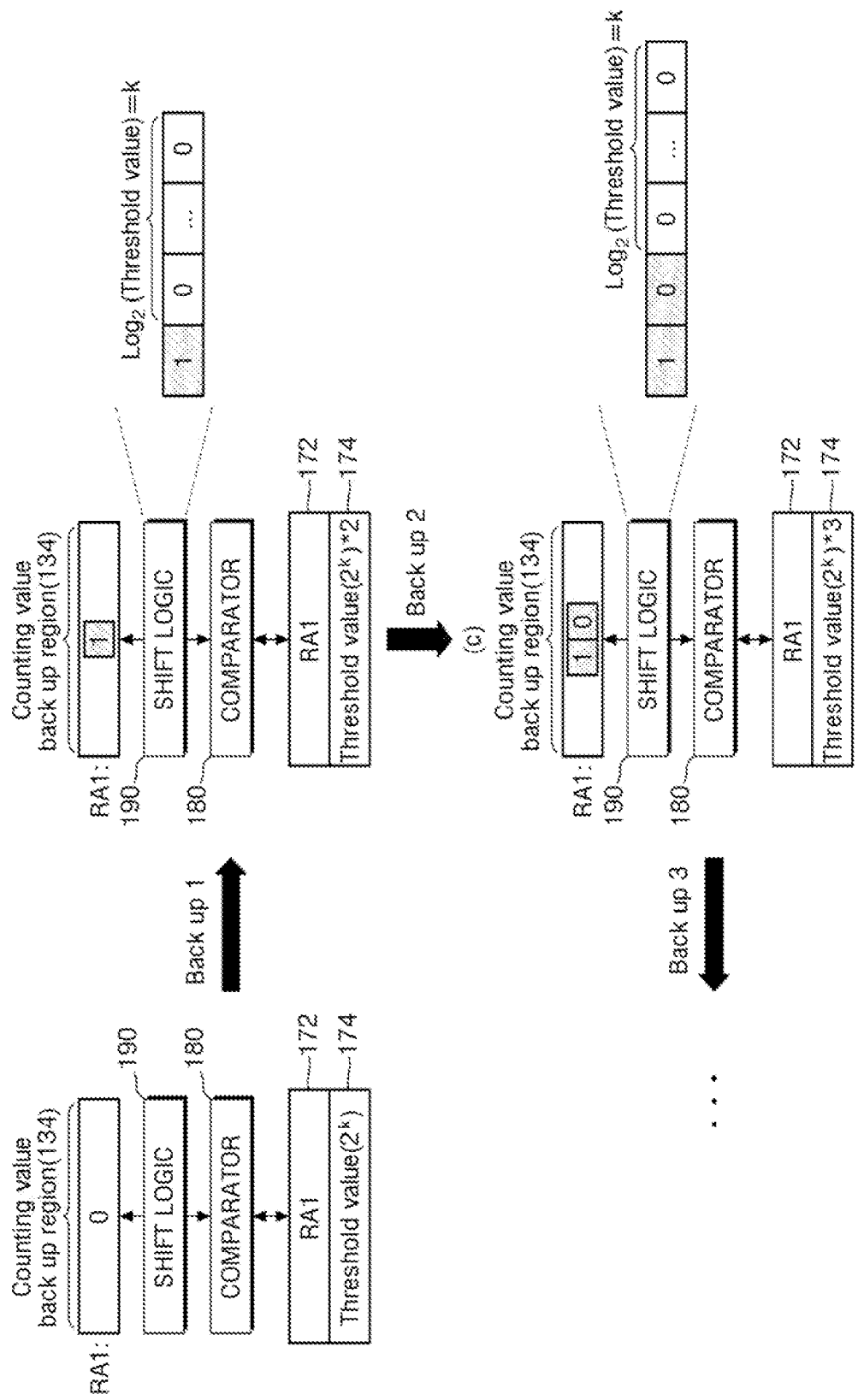
FIG. 16 is an example diagram for illustrating an overwrite operation of another memory device according to some example embodiments.

FIG. 16 is an example diagram for illustrating an overwrite operation of another memory device according to some example embodiments.

Referring to FIG. 4, FIG. 15 and FIG. 16, the first row address RA1 and a corresponding counting value are described by way of example.

First, in a state (a), it is assumed that the backed-up counting value stored in the counting value backup region 134 and corresponding to the first word-line WL1 activated by the first row address RA1 is "0". Further, it is assumed that the counting value 174 corresponding to the first row address RA1 and stored in the counting table 170 is the threshold value. The threshold value may be $k^{th}$ power of 2, i.e., $2^k$ (k is a natural number).

The shift logic circuit 190 may shift up binary bits of the backed-up counting value 136a "0" corresponding to the first word-line WL1 by the k digits, and transmit the shifting result to the comparator 180.

The comparator 180 compares the value obtained by shifting binary bits of the backed-up counting value 136a corresponding to the first word-line WL1 by $\log_2^{threshold\ value} = \log_2^{2^k} = k$ digits with the counting value 174 stored in the counting table 170.

Thus, the comparator 180 determines whether a difference between the value obtained by shifting up binary bits of the backed-up counting value 136a corresponding to the first word-line WL1 by $\log_2^{threshold\ value} = \log_2^{2^k} = k$ digits and the counting value 174 stored in the counting table 170 is greater than or equal to the threshold value.

For example, because the counting value 174 "threshold value" stored in the counting table 170 is greater than or equal to a value (0+threshold value=threshold value) obtained by adding the threshold value to the value 0 obtained by shifting up binary bits of the backed-up counting value 136a "0" (corresponding to the first word-line WL1) by the k digits, the comparator 180 may back up the counting value 174 "threshold value" stored in the counting table 170 into the counting value backup region 134 corresponding to the first word-line WL1.

The shift logic circuit 190 stores an integer value "1" (as an integer of an integer multiple of the threshold value) in the counting value backup region 134 corresponding to the first word-line WL1.

Thus, instead of backing up the threshold value as the counting value 174 stored in the counting table 170 in the state (a) into the counting value backup region 134 corresponding to the first word-line WL1, the integer value "1" (as an integer of an integer multiple of the threshold value) is backed up into the counting value backup region 134 corresponding to the first word-line WL1. Thus, the size of the counting value backup region 134 may be reduced to correspondingly increase the size of the data region 132.

In the state (b) where "1" is backed up in the counting value backup region 134 corresponding to the first word-line WL1, it is assumed that the counting value 174 corresponding to the first row address RA1 and stored in the counting table 170 is the threshold value*2.

The shift logic circuit 190 may shift up binary bits of the backed-up counting value 136a "1" corresponding to the first word-line WL1 by k the digits, and transmit the shifting result to the comparator 180.

The comparator 180 compares the value (1 . . . 0) obtained by shifting up the backed-up counting value "1" corresponding to the first word-line WL1 by the k digits with the counting value "threshold value*2" stored in the counting table 170.

Thus, the comparator 180 determines whether a difference between the value obtained by shifting up the binary number of the backed-up counting value "1" corresponding to the first word-line WL1 by k digits and the counting value "threshold value*2" stored in the counting table 170 is greater than or equal to the threshold value.

For example, because the counting value "threshold value*2" stored in the counting table 170 is greater than or equal to a value obtained by adding the threshold value to the value obtained by shifting up the binary number of the backed-up counting value "1" corresponding to the first word-line WL1 by k digits, the comparator 180 may back up the counting value "threshold value*2" stored in the counting table 170 into the counting value backup region 134 corresponding to the first word-line WL1.

In connection with this, shift logic circuit 190 stores an integer value "2" as an integer of an integer multiple of the threshold value into the counting value backup region 134 corresponding to the first word-line WL1.

Thus, instead of backing up the counting value "threshold value*2" stored in the counting table 170 in the state (b) into the counting value backup region 134 corresponding to the first word-line WL1, the integer value "2" (as an integer of an integer multiple of the threshold value) is backed up into the counting value backup region 134 corresponding to the first word-line WL1. Thus, the size of the counting value backup region 134 may be reduced to correspondingly increase the size of the data region 132.

In the state (c) where "2" is backed up in the counting value backup region 134 corresponding to the first word-line WL1, it is assumed that the counting value 174 corresponding to the first row address RA1 and stored in the counting table 170 is the threshold value*3.

The shift logic circuit 190 may shift up the binary number of the backed-up counting value "2" corresponding to the first word-line WL1 by k digits, and transmit the shifting result to the comparator 180.

The comparator 180 compares the value obtained by shifting up the binary number the backed-up counting value "2" corresponding to the first word-line WL1 by k digits with the counting value "threshold value*3" stored in the counting table 170.

Thus, the comparator 180 determines whether a difference between the value obtained by shifting up the binary number of the backed-up counting value "2" corresponding to the first word-line WL1 by k digits and the counting value "threshold value*3" stored in the counting table 170 is greater than or equal to the threshold value.

For example, because the counting value "threshold value*3" stored in the counting table 170 is greater than or equal to a value obtained by adding the threshold value to the value (10 . . . 0) obtained by shifting up the binary number of the backed-up counting value "2" corresponding to the first word-line WL1 by k digits, the comparator 180 may back up the counting value "threshold value*3" stored in the counting table 170 into the counting value backup region 134 corresponding to the first word-line WL1.

The shift logic circuit 190 stores an integer value "3" as an integer of an integer multiple of the threshold value into the counting value backup region 134 corresponding to the first word-line WL1.

Thus, instead of backing up the counting value "threshold value*3" stored in the counting table 170 in the state (c) into the counting value backup region 134 corresponding to the first word-line WL1, the integer value "3" (as an integer of an integer multiple of the threshold value) is backed up into the counting value backup region 134 corresponding to the first word-line WL1. Thus, the size of the counting value backup region 134 may be reduced to correspondingly increase the size of the data region 132.

The above-described operation of the memory device according to some example embodiments using the comparator 180 and the shift logic circuit 190 may allow for reducing the size of the backed-up counting value 136 stored in the counting value backup region 134 of the memory cell array. This may further increase the proportion of the data region 132 of the memory cell array.

Hereinafter, the above operation will be further described based on flowcharts of FIG. 17 and FIG. 18. The operations in FIG. 17 and FIG. 18 are based on a case when the threshold value is $k^{th}$ power of 2, i.e., $2^k$ (k is a natural number).

Figure 17:
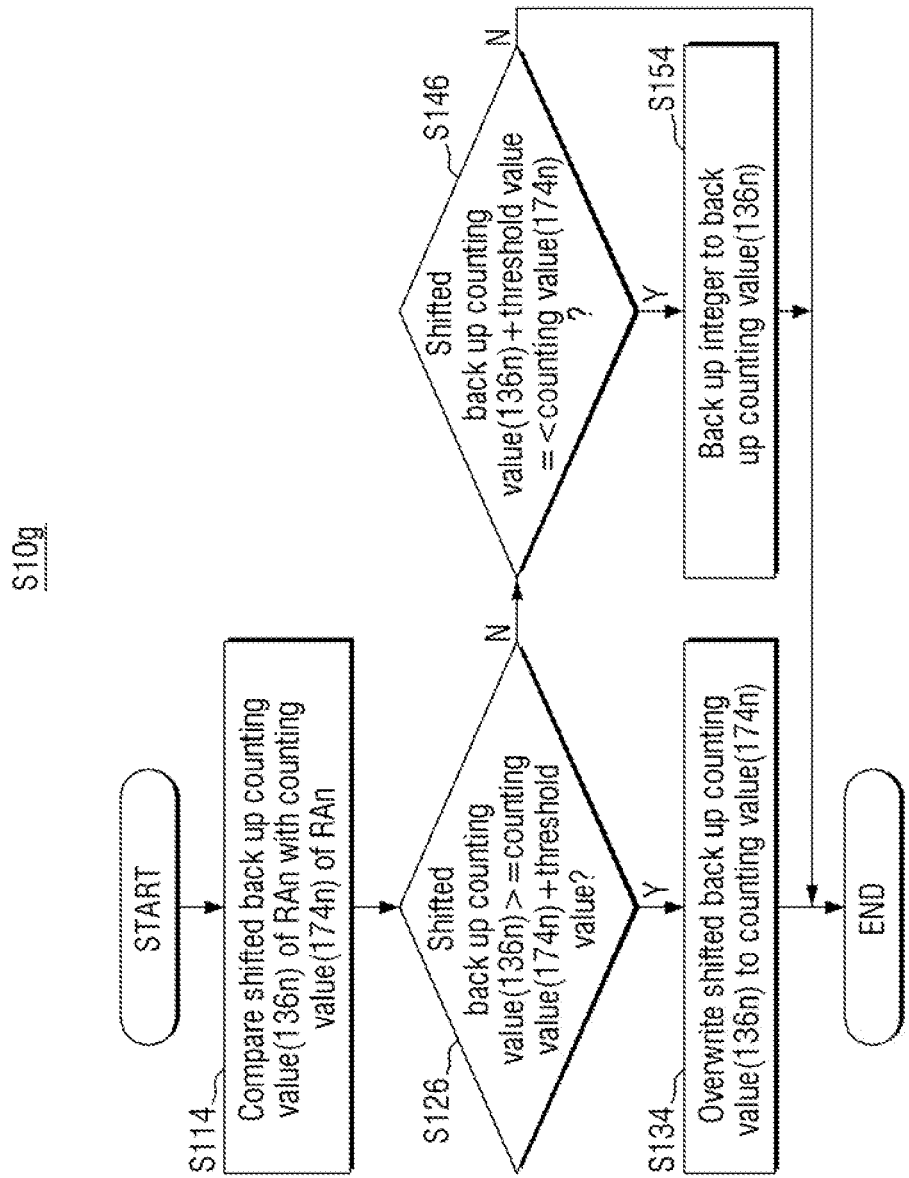
FIG. 17 and FIG. 18 are flowcharts for illustrating other operations of a memory device according to some example embodiments.
Figure 18:
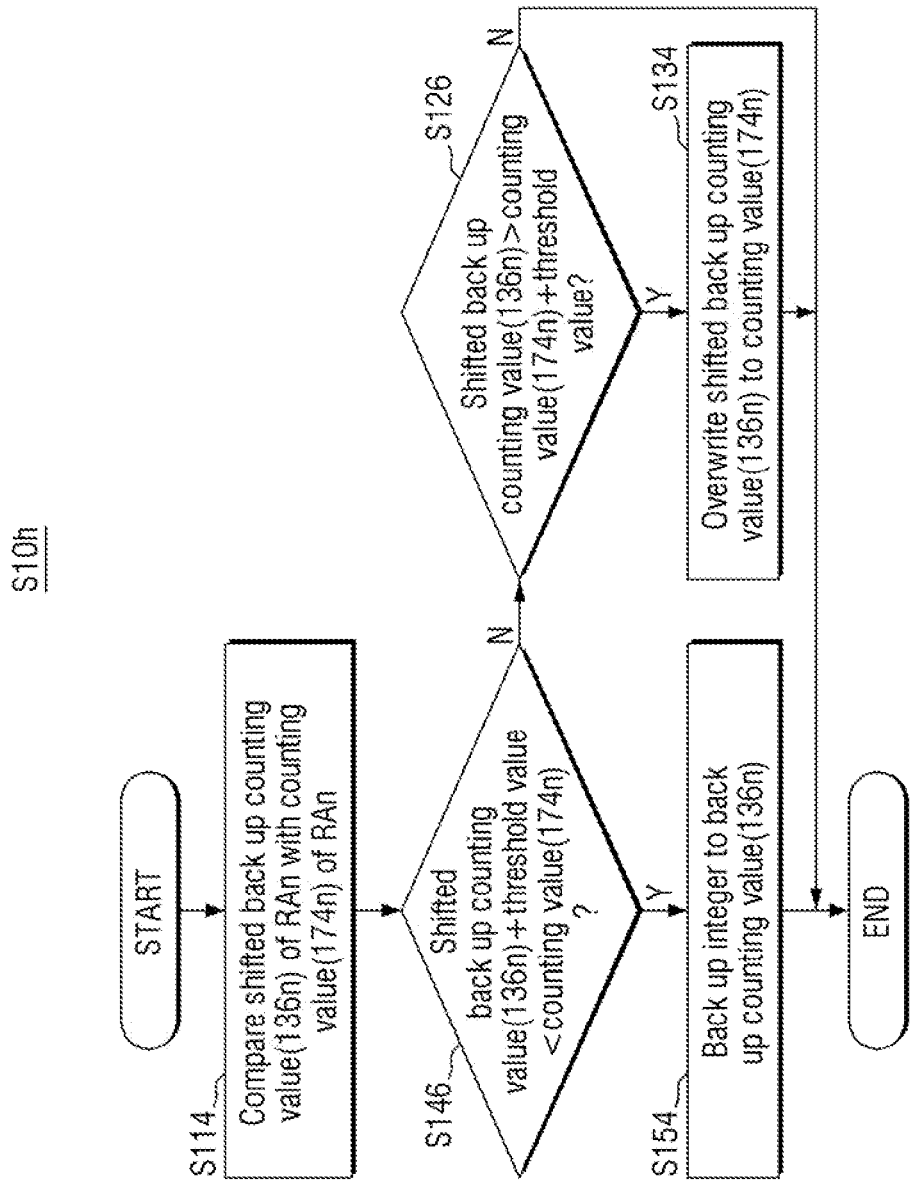

FIG. 17 and FIG. 18 are flowcharts for illustrating other operations of a memory device according to some example embodiments.

Referring to FIG. 15 to FIG. 17, in an operation S10g of the memory device according to some example embodiments, the comparator 180 compares the value obtained by shifting the binary number of the backed-up counting value stored in the counting value backup region 134 (corresponding to the n-th word-line WLn activated by the n-th row address RAn, and received from the shift logic circuit 190) with the counting value 174 (corresponding to the n-th row address RAn and stored in the counting table 170), in S114.

The comparator 180 determines whether the value obtained by shifting up the binary number of the backed-up counting value 136n (corresponding to the n-th word-line WLn) by k bits is equal to or greater than a value obtained by adding the threshold value to the counting value 174n stored in the counting table 170, in S126.

When it is determined that the value obtained by shifting up the binary number of the backed-up counting value 136n (corresponding to the n-th word-line WLn) by k bits is equal to or greater than the value obtained by adding the threshold value to the counting value 174n stored in the counting table 170 (S126, Y), the comparator 180 overwrites the value obtained by shifting up the binary number of the backed-up counting value 136n (corresponding to the n-th word-line WLn) by k bits onto the counting value 174n stored in the counting table 170, in S134.

On the other hand, when it is determined that the value obtained by shifting up the binary number of the backed-up counting value 136n (corresponding to the n-th word-line WLn) by k bits is smaller than the value obtained by adding the threshold value to the counting value 174n stored in the counting table 170 (S126, N), the comparator 180 determines whether the counting value 174n stored in the counting table 170 is greater than or equal to the value obtained by shifting up the binary number of the backed-up counting value 136n (corresponding to the n-th word-line WLn) by k bits, in S146.

When the counting value 174n stored in the counting table 170 is greater than or equal to the value obtained by adding the threshold value to the value obtained by shifting up the binary number of the backed-up counting value 136n (corresponding to the n-th word-line WLn) by k bits (S146, Y), the comparator 180 may back up an integer obtained by dividing a difference between the counting value 174n stored in the counting table 170 and the value obtained by shifting up the binary number of the backed-up counting value 136n (corresponding to the n-th word-line WLn) by k bits by the threshold value into the backed-up counting value 136n corresponding to the n-th word-line WLn, in S154.

After the overwrite operation S134 and the backup operation S154, when it is determined that the row hammering mitigation operation is necessary, the row hammering mitigation operation may be performed.

Referring to FIG. 15, FIG. 16, and FIG. 18, an operation S10h of the memory device according to some example embodiments is different from the operation S10g of the memory device of FIG. 17 in that, after the comparison operation S114, the comparator 180 first determines whether the counting value 174n stored in the counting table 170 is greater than or equal to a value obtained by adding the threshold value to the value obtained by shifting up the binary number of the backed-up counting value 136n (corresponding to the n-th word-line WLn) by k bits, in S146.

The subsequent operations are similar to those as described above based on FIG. 17, and thus descriptions thereof are omitted.

Figure 19:
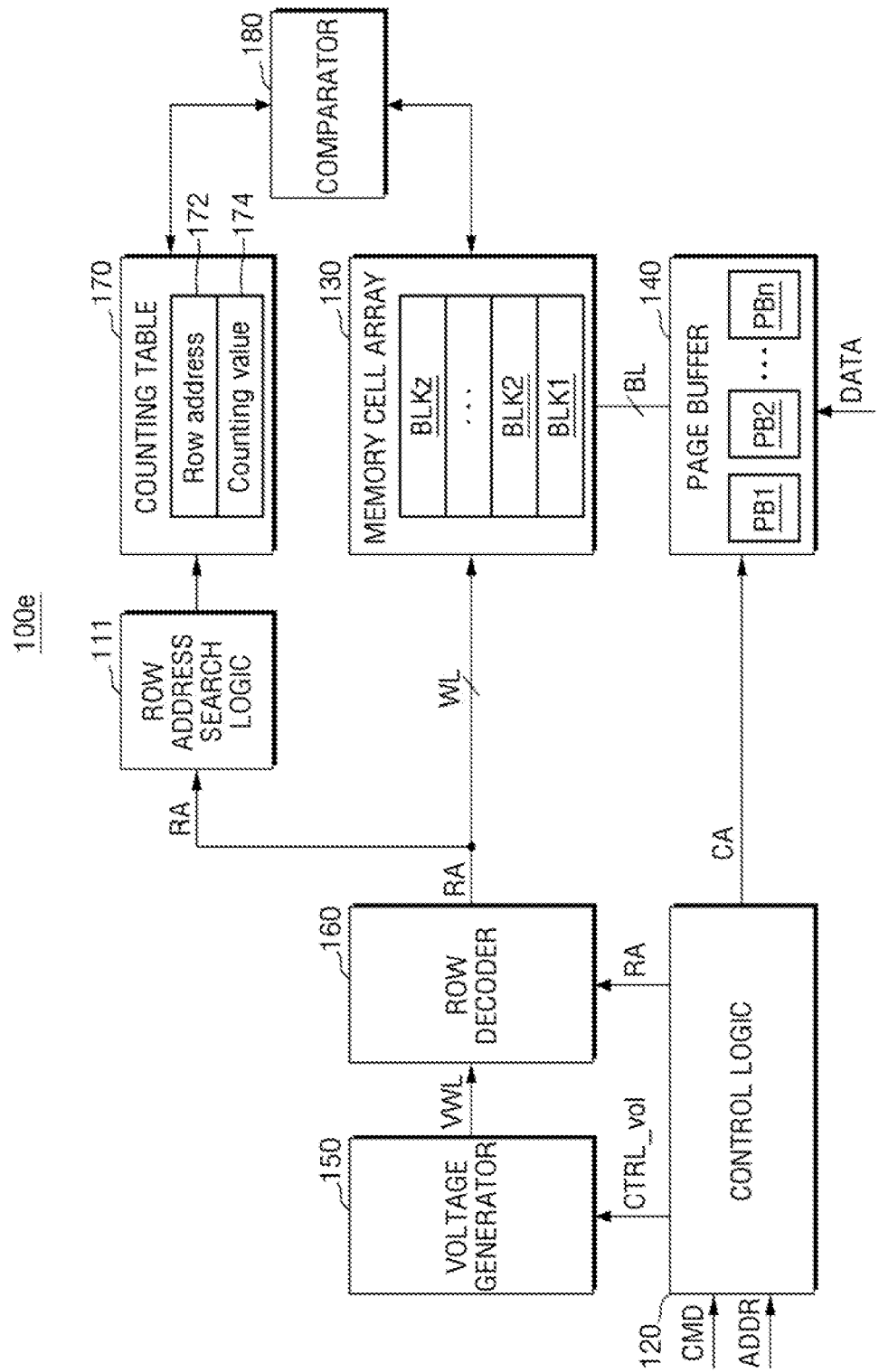
FIG. 19 to FIG. 21 are block diagrams illustrating another memory device according to some example embodiments.
Figure 20:
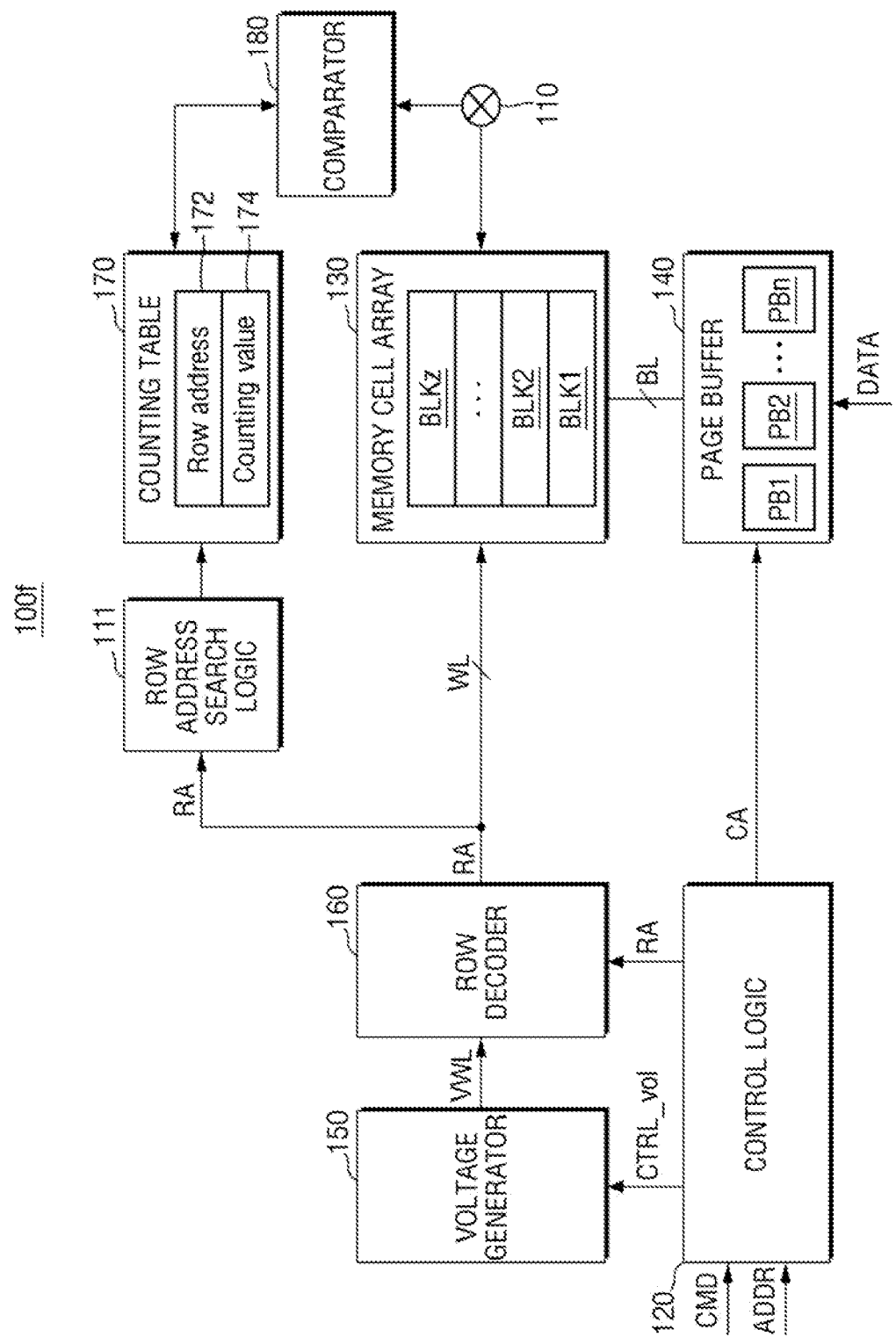
Figure 21:
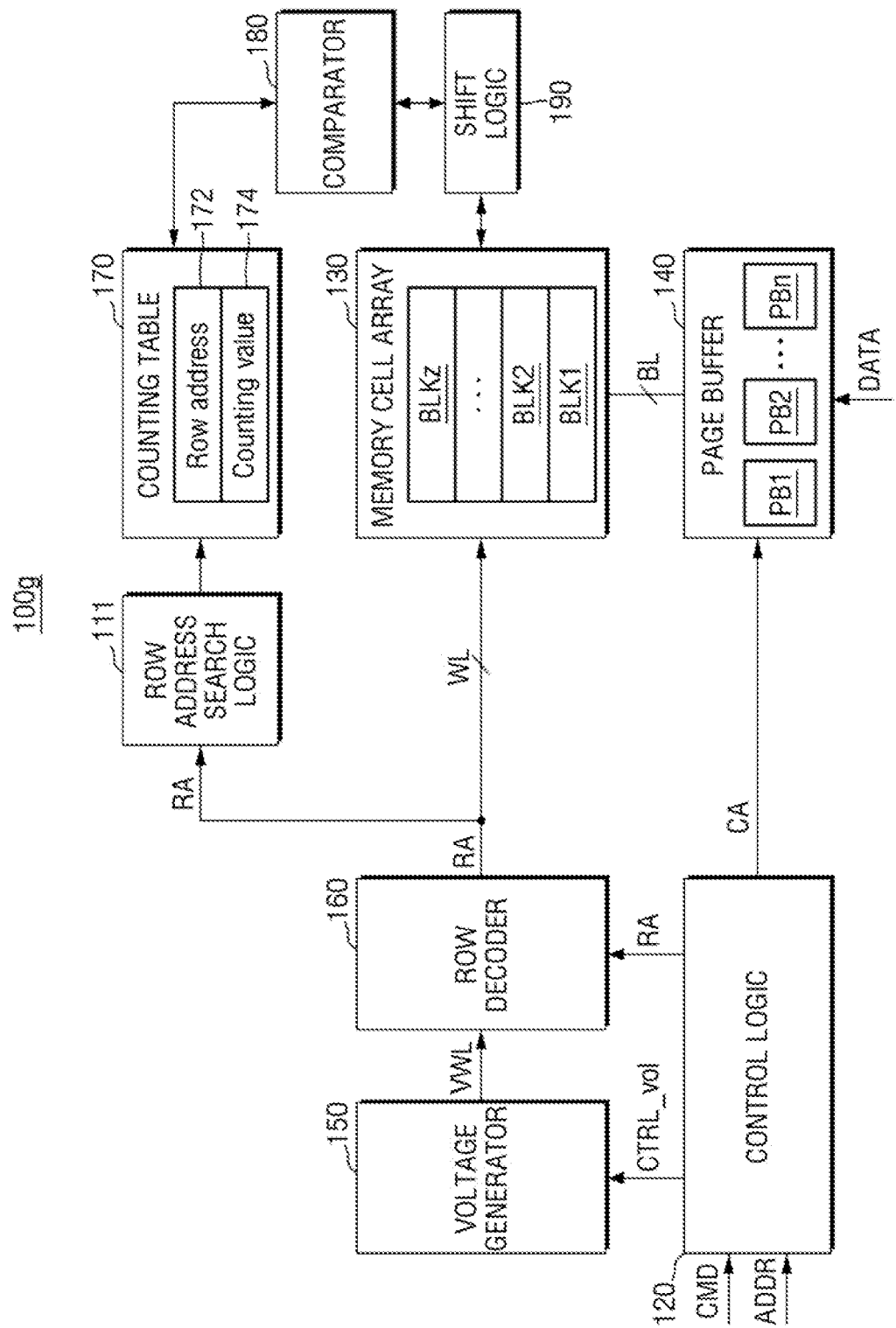

FIG. 19 to FIG. 21 are block diagrams illustrating another memory device according to some example embodiments.

Referring to FIG. 19, a memory device 100e according to some example embodiments further includes a row address search logic circuit 111 disposed between the row decoder 160 and the counting table 170, relative to the configuration of the memory device 100a of FIG. 1.

Referring to FIG. 20, a memory device 100f according to some example embodiments further includes the multiplier 110 disposed between the comparator 180 and the memory cell array 130, relative to the configuration of the memory device 100e of FIG. 19.

Referring to FIG. 21, a memory device 100g according to some example embodiments further includes the shift logic circuit 190 disposed between the comparator 180 and the memory cell array 130, relative to the configuration of the memory device 100e of FIG. 19.

In the memory devices 100e, 100f, and 100g in FIG. 19 to FIG. 21, the row address search logic circuit 111 may perform an additional operation before performing the above-described operations S10a to S10h of the memory devices as described above with reference to FIG. 7, FIG. 8, FIG. 9, FIG. 10, FIG. 13, FIG. 14, FIG. 17, and FIG. 18.

Referring to FIG. 19 to FIG. 21, e.g., in the memory devices 100e, 100f, and 100g, the row address search logic circuit 111 may detect whether a row address RA which has been received through the row decoder 160 and has been activated is stored in the counting table 170.

Then, when the row address search logic circuit 111 detects that a row address RA which has been received through the row decoder 160 and has been activated is stored in the counting table 170, the row address search logic circuit 111 may increase the counting value 174 corresponding to the row address RA stored in the counting table 170 by "1". Thereafter, at least one of the operations S10a to S10h of the memory devices as described above based on FIG. 7, FIG. 8, FIG. 9, FIG. 10, FIG. 13, FIG. 14, FIG. 17, and FIG. 18 may be performed.

With reference to the above, and in connection with FIG. 22 described further below, when the row address search logic circuit 111 determines that a row address RA which has been received through the row decoder 160 and has been activated is not present in the counting table 170, the row address search logic circuit 111 may store the row address RA and the counting value in the counting table 170. In connection with this, it is necessary to determine whether there is a storage space in the counting table 170, before storing the row address RA and the counting value therein.

When it is determined that a space for storing therein the activated row address RA and the counting value is present in the counting table 170, the activated row address RA and the counting value may be stored in the counting table 170. Thereafter, the counting value corresponding to the activated row address RA stored in the counting table 170 is set to "1".

When it is determined that a space for storing therein the activated row address RA and the counting value is not present in the counting table 170, a row address already stored in the counting table 170 and a corresponding counting value may be deleted therefrom. In connection with this, row address information with a smallest counting value may be deleted therefrom.

Thereafter, the activated row address RA and the counting value are stored in the counting table 170. Thereafter, the counting value of the activated row address RA stored in the counting table 170 is set to "1".

Thereafter, at least one of the operations S10a to S10h of the memory devices as described above based on FIG. 7, FIG. 8, FIG. 9, FIG. 10, FIG. 13, FIG. 14, FIG. 17, and FIG. 18 may be performed.

Figure 22:
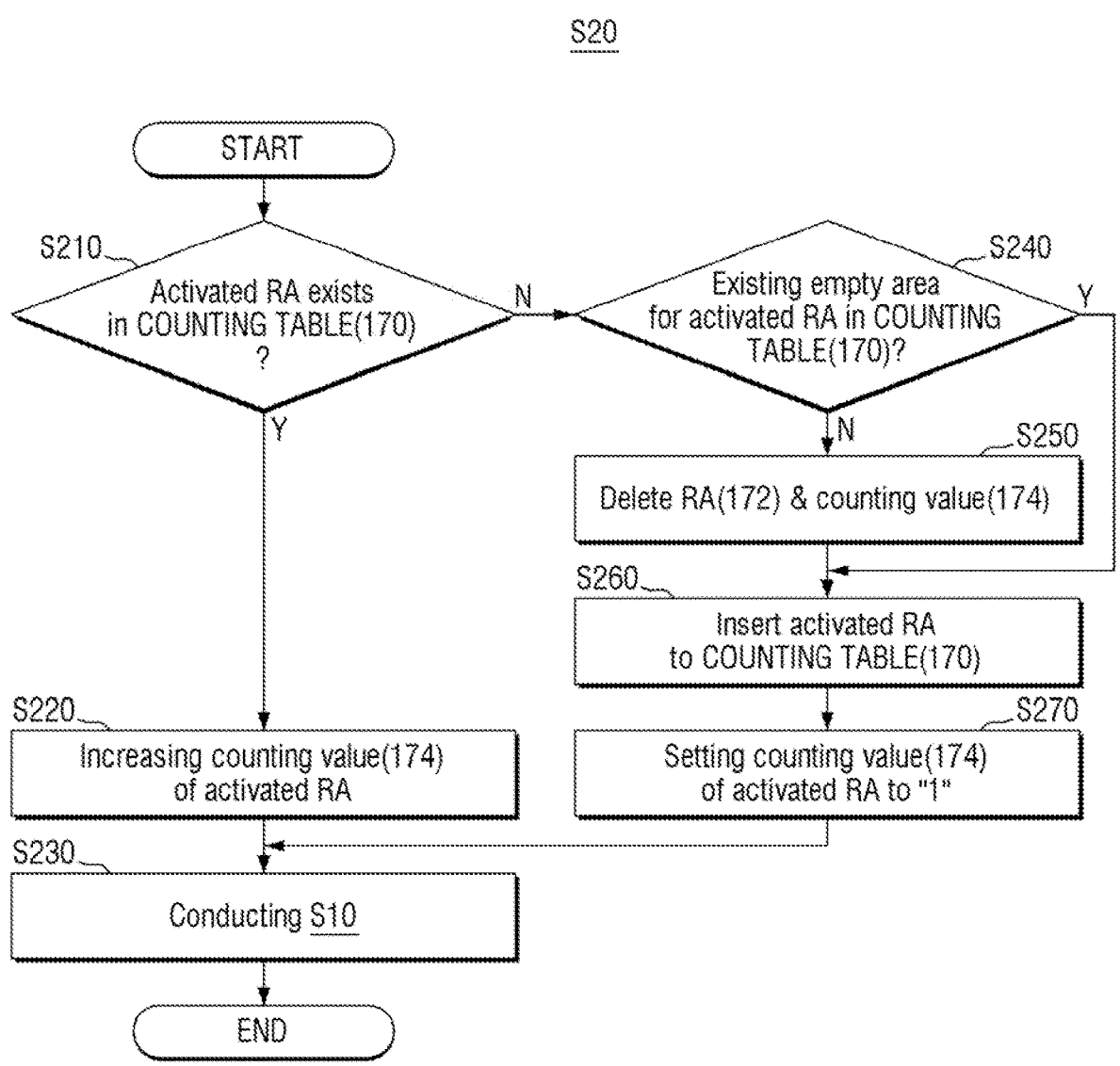
FIG. 22 to FIG. 23 are flowcharts for illustrating other operations of a memory device according to some example embodiments.

The above-described operations of the memory devices 100e, 100f, and 100g will now be further described based on a flowchart of FIG. 22.

Figure 23:
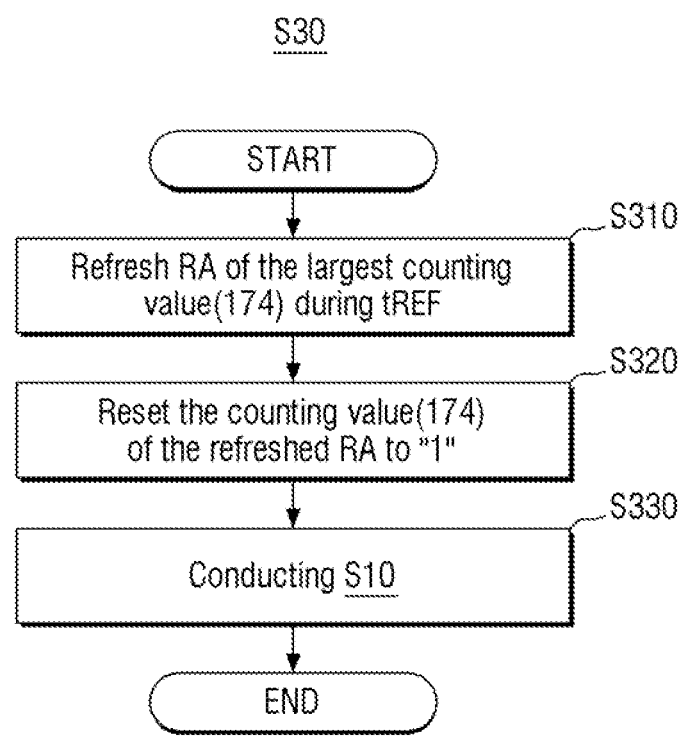

FIG. 22 to FIG. 23 are flowcharts for illustrating other operations of a memory device according to some example embodiments.

Referring to FIG. 19 to FIG. 22, by way of example, in operation S210 for each of the memory devices 100e, 100f, and 100g, the row address search logic circuit 111 may detect whether the row address RA which has been received through the row decoder 160 and has been activated is stored in the counting table 170, in S210.

Then, when the row address search logic circuit 111 determines that the row address RA which has been received through the row decoder 160 and has been activated is stored in the counting table 170 (S210, Y), the row address search logic circuit 111 increases the counting value 174 corresponding to the row address RA stored in the counting table 170 by 1, in S220. Thereafter, at least one of the operations S10a to S10h of the memory device as described above based on FIG. 7, FIG. 8, FIG. 9, FIG. 10, FIG. 13, FIG. 14, FIG. 17, and FIG. 18 may be performed, in S230.

On the other hand, when the row address search logic circuit 111 determines that the row address RA which has been received through the row decoder 160 and has been activated is absent from the counting table 170 (S210, N), the row address search logic circuit 111 stores the row address RA and the counting value in the counting table 170, in which case the row address search logic circuit 111 determines whether there is a storage space in the counting table 170 before storing the row address RA and the counting value therein, in S240.

When it is determined that the space for storing therein the activated row address RA and the counting value is present in the counting table 170 (S240, Y), the row address search logic circuit 111 may store the activated row address RA and the counting value in the counting table 170, in S260. Thereafter, the row address search logic circuit 111 may set the counting value corresponding to the activated row address RA stored in the counting table 170 to "1", in S270.

On the other hand, when it is determined that the space for storing therein the activated row address RA and the counting value is not present in the counting table 170 (S240, N), the row address search logic circuit 111 may delete a row address already stored in the counting table 170 and a corresponding counting value from the counting table, in S250. The row address search logic circuit 111 may delete some of the counting values stored in the counting table 170. In another example, the row address search logic circuit 111 may delete row address information having the smallest counting value stored in the counting table 170.

Thereafter, the row address search logic circuit 111 stores the activated row address RA and the counting value in the counting table 170. Thereafter, the row address search logic circuit 111 sets the counting value corresponding to the activated row address RA stored in the counting table 170 to "1", in S270.

Thereafter, at least one of the operations S10a to S10h of the memory device as described based on FIG. 7, FIG. 8, FIG. 9, FIG. 10, FIG. 13, FIG. 14, FIG. 17, and FIG. 18 may be performed, in S270.

Referring back to FIG. 1, FIG. 3, FIG. 11, FIG. 15, and FIG. 19 to FIG. 21, and in connection with FIG. 23 described further below, each of the memory devices 100a to 100g according to some example embodiments may perform an additional operation during a refresh period, and before performing the operations S10a to S10h of the memory device described above with reference to FIG. 1 to FIG. 18.

For example, information in the DRAM is stored based on charges accumulated in the capacitor in the cell. The storage of the information is temporary. Therefore, the DRAM memory cell is required to be periodically refreshed by a special external circuit to prevent data stored in the memory cell from being changed due to leakage current. An external refresh circuit must drive each row of the DRAM once within a refresh period. This may be performed by continuously changing an internal address based on a command signal applied from an external component.

The control logic circuit 120 may refresh a row address having a largest value among the counting values 174 of the counting table 170 during the refresh period.

The counting value 174 corresponding to the row address which has been refreshed may be set to "1". Thereafter, at least one of the operations S10a to S10h of the memory device as described above with reference to FIG. 7, FIG. 8, FIG. 9, FIG. 10, FIG. 13, FIG. 14, FIG. 17, and FIG. 18 may be performed.

Hereinafter, the above-described operation will be further described based on a flowchart of FIG. 23.

Referring to FIG. 23, in an operation S30 of the memory device according to some example embodiments, the control logic circuit 120 may refresh the row address having the largest value among the counting values 174 of the counting table 170 during the refresh period, in S310.

Thereafter, the counting value 174 corresponding to the row address which has been refreshed may be set to "1". Thereafter, at least one of the operations S10a to S10h of the memory device as described above with reference to FIG. 7, FIG. 8, FIG. 9, FIG. 10, FIG. 13, FIG. 14, FIG. 17, and FIG. 18 may be performed.

Figure 24:
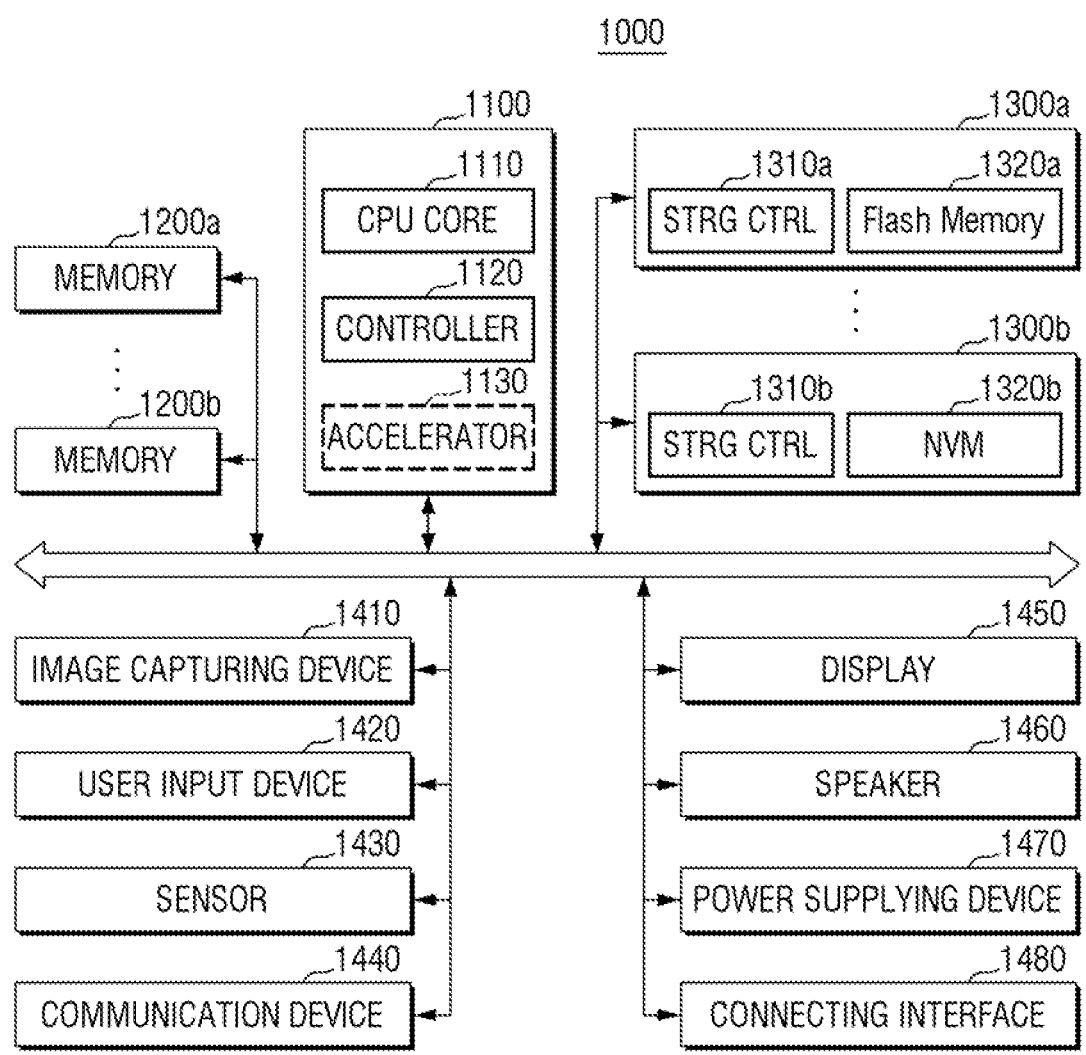
FIG. 24 is a view showing a memory system including a memory device according to some example embodiments.

FIG. 24 is a view showing a memory system including a memory device according to some example embodiments.

Referring to FIG. 24, a memory system 1000 according to some example embodiments may include a mobile system such as a portable communication terminal, a smartphone smart phone, a tablet PC (tablet personal computer), a wearable device, a healthcare device or an IOT (internet of things) device. However, the memory system 1000 in FIG. 24 may be a personal computer, a laptop computer, a server, a media player, or a vehicle device such as a navigation device, etc.

The memory system 1000 may include a main processor 1100, memories 1200a and 1200b, and storage devices 1300a and 1300b. The memory system 1000 may additionally include at least one of an image capturing device 1410, a user input device 1420, a sensor 1430, a communication device 1440, a display 1450, a speaker 1460, a power supply device 1470, and a connection interface 1480.

Hereinafter, it is assumed that at least one of the memories 1200a and 1200b is at least one of the memory devices according to some example embodiments described based on FIG. 1 to FIG. 23.

The main processor 1100 may control overall operation of the memory system 1000, more specifically, operations of other components constituting the memory system 1000. The main processor 1100 may be implemented as a general-purpose processor, a dedicated processor, or an application processor.

The main processor 1100 may include at least one CPU core 1110, and may further include a controller 1120 for controlling the memories 1200a and 1200b and/or the storage devices 1300a and 1300b. According to an example embodiment, the main processor 1100 may further include an accelerator 1130 as a dedicated circuit for high-speed data operation such as AI (artificial intelligence) data operation. The accelerator 1130 may include a GPU (Graphics Processing Unit), an NPU (Neural Processing Unit), and/or a DPU (Data Processing Unit), and may be implemented as a separate chip physically independent from other components of the main processor 1100.

The memories 1200a and 1200b may be used as a main memory device of the memory system 1000, and may include a volatile memory such as SRAM and/or DRAM, or may include a non-volatile memory such as flash memory, PRAM and/or RRAM. The memories 1200a and 1200b and the main processor 1100 may be implemented in the same package.

The storage devices 1300a and 1300b may function as a non-volatile storage device that stores data therein regardless of power supply, and may have a relatively large storage capacity compared to the memories 1200a and 1200b. The storage devices 1300a and 1300b may respectively include storage controllers 1310a and 1310b, and non-volatile memories (NVM) 1320a and 1320b that store therein data under control of the storage controllers 1310a and 1310b. Each of the non-volatile memories 1320a and 1320b may include a flash memory of a 2D (2-dimensional) structure or 3D (3-dimensional) V-NAND (Vertical NAND) structure, or may include other types of non-volatile memories such as PRAM and/or RRAM.

The storage devices 1300a and 1300b may be included in the memory system 1000 while being physically separated from the main processor 1100. In another implementation, the storage devices 1300a and 1300b and the main processor 1100 may be implemented in the same package. Further, each of the storage devices 1300a and 1300b may be embodied as SSD (solid state device) or a memory card and thus may be detachably coupled to other components of the memory system 1000 via an interface such as the connection interface 1480 which will be described later. Each of the storage devices 1300a and 1300b may be a device to which a standard protocol such as UFS (Universal Flash Storage), eMMC (embedded multi-media card), or NVMe (non-volatile memory express) is applied, for example.

The image capturing device 1410 may capture a still image or a moving image, and may include a camera, a camcorder, and/or a webcam.

The user input device 1420 may receive various types of data input from a user of the memory system 1000, and may be embodied as a touch pad, a keyboard, a mouse, and/or a microphone.

The sensor 1430 may detect various types of physical quantities that may be obtained from an outside out of the memory system 1000, and may convert the sensed physical quantity into an electrical signal. The sensor 1430 may include a temperature sensor, a pressure sensor, an illumination sensor, a position sensor, an acceleration sensor, a biosensor, and/or a gyroscope sensor.

The communication device 1440 may transmit and receive signals to and from other devices out of the memory system 1000 according to various communication protocols. The communication device 1440 may be composed of an antenna, a transceiver, and/or a modem.

The display 1450 and the speaker 1460 may function as output devices for outputting visual information and audible information to the user of the memory system 1000, respectively.

The power supply device 1470 may appropriately convert power supplied from a battery (not shown) built into the memory system 1000 and/or an external power supply and supply the converted power to each of the components of the memory system 1000.

The connection interface 1480 may provide a connection between the memory system 1000 and an external device that is connected to the memory system 1000 to transmit and receive data to and from the memory system 1000. The connection interface 1480 may be embodied as various interfaces such as ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI express), NVMe, IEEE 1394, USB (universal serial bus), SD (secure digital) card, MMC (multi-media card), eMMC, UFS, eUFS (embedded Universal Flash Storage), CF (compact flash) card interface, etc.

By way of summation and review, whenever data is input/output to a memory cell, a word-line toggles between an active state and an inactive state. As a coupling effect between adjacent word-lines increases with increasing integration, data of a memory cell connected to a word-line adjacent to a word-line which is frequently activated may be damaged. This phenomenon is referred to as row hammering. Word-line disturbance causes data of the memory cell to be damaged before the memory cell is refreshed.

As described above, embodiments may provide a memory device that may prevent loss of a counting value of activation of a word-line in a register, which may otherwise occur during a row hammering mitigation operation. Embodiments may provide a memory system that may prevent loss of an active counting value of a word-line in a register, which may otherwise occur during a row hammering mitigation operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a memory cell array including a plurality of memory cells connected to a first word-line, wherein each row of the plurality of memory cells includes a data region in which data is stored and a counting value backup region in which a number of times the first word-line is activated is backed up;
a counting table for storing therein a first row address, corresponding to the first word-line, and a first counting value, as a counting result of the number of times the first word-line is activated; and
a comparator configured to:
compare the first counting value with a first backed-up counting value stored in the counting value backup region; and
when the first counting value is greater than the first backed-up counting value, back up the first counting value in the counting value backup region; or
when the first backed-up counting value is greater than the first counting value, overwrite the first backed-up counting value into the counting table.

2. The memory device as claimed in claim 1, further comprising a mitigation logic circuit configured to:
determine whether row hammering has occurred on the first word-line; and
upon determination that the row hammering has occurred on the first word-line, perform a target-row refresh operation on a word-line adjacent to the first word-line,
wherein the counting table is included in the mitigation logic circuit.

3. The memory device as claimed in claim 1, wherein the comparator is further configured to:
when the first counting value is greater than a sum of a threshold value and the first backed-up counting value, back up the first counting value in the counting value backup region; or
when the first backed-up counting value is greater than a sum of the threshold value and the first counting value, overwrite the first backed-up counting value into the counting table.

4. The memory device as claimed in claim 3, further comprising a multiplier disposed between the memory cell array and the comparator, wherein:
the first backed-up counting value is n, where n is a natural number,
the multiplier multiplies n by the threshold value, and delivers the multiplying result to the comparator, and
the comparator is further configured to:
when a value obtained by multiplying n by the threshold value is greater than the sum of the threshold value and the first counting value, overwrite the value obtained by multiplying n by the threshold value into the counting table; or
when the first counting value is greater than a sum of the threshold value and the value obtained by multiplying n by the threshold value, back up n+1 into the counting value backup region.

5. The memory device as claimed in claim 3, further comprising a shift logic circuit disposed between the memory cell array and the comparator, wherein:
the first backed-up counting value is n (n is a natural number),
the threshold value is $2^k$ ((k is a natural number),
the shift logic circuit shifts up a binary number of n by k binary digits, and transmits the shifting result to the comparator, and
the comparator is further configured to:
when a value obtained by shifting up the binary number of n by the k binary digits is greater than the sum of the threshold value and the first counting value, overwrite the value obtained by shifting up the binary number of n by the k binary digits into the counting table; or
when the first counting value is greater than a sum of the threshold value and the value obtained by shifting up the binary number of n by the k binary digits, back up n+1 into the counting value backup region.

6. The memory device as claimed in claim 1, further comprising a row address search logic circuit disposed between the memory cell array and the counting table,
wherein the row address search logic circuit is configured to detect whether a second row address corresponding to a second word-line to be activated among word-lines included in the memory cell array is present in the counting table.

7. The memory device as claimed in claim 6, wherein, when the second row address is present in the counting table, the row address search logic circuit is further configured to increase, by 1, a second counting value as a counting result of a number of times the second row address is activated.

8. The memory device as claimed in claim 6, wherein, when the second row address is absent from the counting table, the row address search logic circuit is further configured to determine whether a storage space for storing therein the second row address and a second counting value as a counting result of a number of times the second row address is activated is present in the counting table,
wherein, when the storage space is absent from the counting table, the row address search logic circuit is further configured to delete at least one counting value among counting values stored in the counting table, and at least one row address corresponding to the at last one counting value, and store the second row address and the second counting value in the counting table.

9. The memory device as claimed in claim 8, wherein the at least one counting value includes a smallest counting value among the counting values stored in the counting table.

10. A memory device, comprising:
a control logic circuit configured to receive a command and an address from an external component, generate a first voltage control signal based on the command, and generate a first row address and a first column address based on the address;
a voltage generator for generating a first word-line voltage based on the first voltage control signal;
a row decoder for receiving the first word-line voltage and the first row address, and delivering the first word-line voltage to the first row address; and
a memory cell array including a plurality of memory cells connected to a first word-line corresponding to the first row address, wherein each row of the plurality of memory cells includes a data region in which data is stored and a counting value backup region in which a number of times the first word-line is activated is backed up;

a page buffer for receiving the first column address, selecting a bit-line corresponding to the first column address, and transmitting and receiving the data to and from at least some of the plurality of memory cells;

a counting table for storing therein the first row address and a first counting value as a counting result of the number of times the first word-line is activated; and a comparator configured to:
compare the first counting value with a first backed-up counting value stored in the counting value backup region; and
when the first counting value is greater than the first backed-up counting value, back up the first counting value in the counting value backup region; or
when the first backed-up counting value is greater than the first counting value, overwrite the first backed-up counting value into the counting table.

11. The memory device as claimed in claim 10, further comprising a mitigation logic circuit configured to:
determine whether row hammering has occurred on the first word-line; and
upon determination that the row hammering has occurred on the first word-line, perform a target-row refresh operation on a word-line adjacent to the first word-line,
wherein the counting table is included in the mitigation logic circuit.

12. The memory device as claimed in claim 10, wherein the comparator is further configured to:
when the first counting value is greater than a sum of a threshold value and the first backed-up counting value, back up the first counting value in the counting value backup region; or
when the first backed-up counting value is greater than a sum of the threshold value and the first counting value, overwrite the first backed-up counting value into the counting table.

13. The memory device as claimed in claim 12, further comprising a multiplier disposed between the memory cell array and the comparator, wherein:
the first backed-up counting value is n, where n is a natural number,
the multiplier multiplies n by the threshold value, and delivers the multiplying result to the comparator, and
the comparator is further configured to:
when a value obtained by multiplying n by the threshold value is greater than the sum of the threshold value and the first counting value, overwrite the value obtained by multiplying n by the threshold value into the counting table; or
when the first counting value is greater than a sum of the threshold value and the value obtained by multiplying n by the threshold value, back up n+1 into the counting value backup region.

14. The memory device as claimed in claim 12, further comprising a shift logic circuit disposed between the memory cell array and the comparator, wherein:
the first backed-up counting value is n (n is a natural number),
the threshold value is $2^k$ (k is a natural number),
the shift logic circuit shifts up a binary number of n by k binary digits, and transmits the shifting result to the comparator, and the comparator is further configured to:
when a value obtained by shifting up the binary number of n by the k binary digits is greater than the sum of the threshold value and the first counting value, overwrite the value obtained by shifting up the binary number of n by the k binary digits into the counting table; or
when the first counting value is greater than a sum of the threshold value and the value obtained by shifting up the binary number of n by the k binary digits, back up n+1 into the counting value backup region.

15. The memory device as claimed in claim 10, further comprising a row address search logic circuit disposed between the memory cell array and the counting table,
wherein the row address search logic circuit is configured to detect whether a second row address corresponding to a second word-line to be activated among word-lines included in the memory cell array is present in the counting table.

16. The memory device as claimed in claim 15, wherein, when the second row address is present in the counting table, the row address search logic circuit is further configured to increase, by 1, a second counting value as a counting result of a number of times the second row address is activated.

17. The memory device as claimed in claim 15, wherein, when the second row address is absent in the counting table, the row address search logic circuit is further configured to determine whether a storage space for storing therein the second row address and a second counting value as a counting result of a number of times the second row address is activated is present in the counting table,
wherein, when the storage space is absent in the counting table, the row address search logic circuit is further configured to delete at least one counting value among counting values stored in the counting table, and at least one row address corresponding to the at last one counting value, and store the second row address and the second counting value in the counting table.

18. The memory device as claimed in claim 10, wherein the control logic circuit is further configured to:
refresh a second counting value having a largest counting value among counting values stored in the counting table, and a second row address in the memory cell array corresponding to the second counting value during a refresh time; and
reset the second counting value to 1.

19. A memory system, comprising:
a main processor including at least one CPU core; and
a memory device exchanging data with the main processor, the memory device including:
a memory cell array including a plurality of memory cells connected to a first word-line, wherein each row of the plurality of memory cells includes a data region in which data is stored and a counting value backup region in which a number of times the first word-line is activated is backed up;
a counting table for storing therein a first row address, corresponding to the first word-line, and a first counting value, as a counting result of the number of times the first word-line is activated; and
a comparator configured to:
compare the first counting value with a first backed-up counting value stored in the counting value backup region; and
when the first counting value is greater than the first backed-up counting value, back up the first counting value in the counting value backup region; or when the first backed-up counting value is greater than the first counting value, overwrite the first backed-up counting value into the counting table.

20. The memory system as claimed in claim 19, wherein the comparator is further configured to:
when the first counting value is greater than a sum of a threshold value and the first backed-up counting value, back up the first counting value in the counting value backup region; or
when the first backed-up counting value is greater than a sum of the threshold value and the first counting value, overwrite the first backed-up counting value into the counting table.

\* \* \* \* \*